United States Patent
Ryan et al.

(10) Patent No.: US 7,304,969 B2
(45) Date of Patent: *Dec. 4, 2007

(54) AUTOMATIC GAIN CONTROL AND LOW POWER START-OF-PACKET DETECTION FOR A WIRELESS LAN RECEIVER

(75) Inventors: Philip J. Ryan, Stanmore (AU); Andrew R. Adams, Stanmore (AU); John D. O'Sullivan, Hunters Hill (AU); Uri Parker, Kibbutz Shaar Hagolan (IL); Brian Hart, Wollstone-craft (AU); Grzegorz B. Zyner, Castle Hill (AU)

(73) Assignee: Cisco Technology, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/557,728

(22) Filed: Nov. 8, 2006

(65) Prior Publication Data

US 2007/0066259 A1   Mar. 22, 2007

Related U.S. Application Data

(63) Continuation of application No. 10/095,668, filed on Mar. 8, 2002, now Pat. No. 7,151,759.

(60) Provisional application No. 60/322,416, filed on Sep. 14, 2001, provisional application No. 60/322,382, filed on Sep. 14, 2001, provisional application No. 60/283,609, filed on Apr. 13, 2001, provisional application No. 60/277,370, filed on Mar. 19, 2001.

(51) Int. Cl.
*H04Q 7/00* (2006.01)

(52) U.S. Cl. .................. 370/332; 455/226.2; 455/234.1

(58) Field of Classification Search ................ 370/332, 370/252, 328, 320, 321, 342, 335, 324, 318; 455/234.1, 226.2, 67.11, 67.13, 226
See application file for complete search history.

(56) References Cited

U.S. PATENT DOCUMENTS

| | | | |
|---|---|---|---|
| 5,276,685 A | 1/1994 | Kepler et al. | 370/95.3 |
| 5,283,536 A * | 2/1994 | Wheatley et al. | 330/279 |
| 5,301,364 A | 4/1994 | Arens et al. | 455/69 |
| 5,524,009 A | 6/1996 | Tuutijarvi et al. | 370/95.3 |
| 5,579,373 A * | 11/1996 | Jang | 379/59 |
| 5,630,220 A | 5/1997 | Yano | 455/234.1 |
| 5,638,375 A | 6/1997 | Dettro et al. | 370/324 |
| 5,646,963 A | 7/1997 | Dent | 375/340 |
| 5,802,473 A * | 9/1998 | Rutledge et al. | 455/441 |
| 5,884,152 A | 3/1999 | Matsumoto | 455/234.1 |
| 5,917,865 A | 6/1999 | Kopmeiners et al. | 375/345 |
| 6,073,848 A | 6/2000 | Giebel | 235/462.26 |
| 6,157,616 A * | 12/2000 | Whitehead | 370/252 |
| 6,486,820 B1 | 11/2002 | Allworth et al. | 341/161 |
| 6,993,291 B2 | 1/2006 | Parssinen et al. | 455/67.11 |
| 7,020,103 B1 | 3/2006 | Refai | 370/315 |

* cited by examiner

*Primary Examiner*—Chi Pham
*Assistant Examiner*—Alexander O. Boakye
(74) *Attorney, Agent, or Firm*—Dov Rosenfeld; Inventek

(57) ABSTRACT

A digital AGC system for burst operation, particularly suited for receiving packets in a wireless local area network. One embodiment includes a log detector that provides a signal strength measure, called the received signal strength indication (RSSI) over a wide dynamic range. The AGC system includes estimating the power in a received signal by averaging the log of the signal power. The Start of Packet detection avoids using the radio receiver's main analog to digital converters to preserve power.

14 Claims, 11 Drawing Sheets

AUTOMATIC GAIN CONTROL AND LOW POWER START-OF-PACKET DETECTION FOR A WIRELESS LAN RECEIVER

RELATED PATENT APPLICATIONS

The present invention is a continuation of U.S. patent application Ser. No. 10/095,668 file Mar. 8, 2002 now U.S. Pat No. 7,151,759 and titled "AUTOMATIC GAIN CONTROL AND LOW POWER START-OF-PACKET DETECTION FOR A WIRELESS LAN RECEIVER." The contents of such U.S. patent application Ser. No. 10/095,668 are incorporated herein by reference.

U.S. patent application Ser. No. 10/095,668 claims priority of the following U.S. provisional patent applications:
 Ser. No. 60/277,370 entitled SYSTEM USING SINGLE CHIP WIRELESS LAN MODEM AND SINGLE CHIP RADIO TRANSCEIVER AND APPARATI, METHODS, AND SOFTWARE PRODUCTS USED THEREIN OR THEREWITH, filed: Mar. 19, 2001.
 Ser. No. 60/283,609 entitled WIRELESS COMMUNICATION SYSTEM, filed: Apr. 13, 2001.
 Ser. No. 60/322,382 entitled AUTOMATIC GAIN CONTROL AND LOW POWER START-OF-PACKET DETECTION FOR A WIRELESS LAN RECEIVER, filed Sep. 14, 2001.

Such provisional patent applications are incorporated herein by reference.

This invention is related to U.S. Provisional Patent Application Ser. No. 60/322,416 entitled CMOS WIRELESS TRANSCEIVER WITH PROGRAMMABLE CHARACTERISTICS, to Adams et al., filed Sep. 14, 2001, incorporated herein by reference.

BACKGROUND

This invention is related to wireless devices, and in particular to automatic gain control for a packet based radio receiver as might be used in a wireless data network.

Wireless technology is well known and widely used. Networks, such as local area networks are also well known and commonly used. Recently, there has been a lot of effort to implement wireless data networks, in particular wireless local area networks (WLANs). There is a desire to make these networks faster and faster. Prior art wireless systems have in general been limited to rather modest data rates. Such small bandwidth can be aggravating in modern Internet uses.

John D. O'Sullivan, et al., describe portable computer wireless local area network devices that operate in excess of 10 GHz in U.S. Pat. No. 5,487,069, issued Jan. 23, 1996, (herein "O'Sullivan '069"). One object of such devices is to allow portable computer users to access the enterprise's LAN untethered and from any location in several buildings on a campus. A method of converting data into symbols that are used to modulate the radio carrier is offered by O'Sullivan '069 to overcome the problems inherent in spread spectrum systems. The use of symbols establishes many parallel sub-channels that each has modulation periods much longer that any multipath delays that might confuse demodulation. Such Patent is incorporated herein by reference. In effect, O'Sullivan '069 describes the basic coded orthogonal frequency division multiplexing (COFDM) called for in the recently adopted IEEE-802.11a wireless LAN standard.

Carrier frequencies in the ultra-high frequency (UHF) radio bands and above can naturally carry very high modulation rates, so more data bandwidth is inherently available.

Automatic gain control (AGC) for radio receivers is well known and widely used. AGC in general is straightforward for systems that receive continually transmitted signals. Communication in a wireless data network is packet-by-packet ("packetized"). Furthermore, packets might be arriving simultaneously from several radio transmitters, so each set of packets from a particular transmitter requires its own gain setting. Furthermore, a wireless receiver does not know when packets start. Furthermore, the high data rates of newer wireless data networks lead to problems when trying to include AGC in receivers.

The IEEE-802.11a burst transmission begins with a two-part preamble, e.g., a short preamble part and a long-preamble part. The exact start of the burst time (SOP) is important to know not only for the purpose of AGC, but also, for example in order to correctly decode the preambles and to carry out the receiver's subsequent demodulation process. There is thus a need to determine SOP quickly in an environment where the carrier frequency and code phase are uncertain. There is also a need to determine the correct gain setting over and over again and relatively quickly; there typically is not much time available for SOP and gain determination. Then there is a need to quickly set the gains of one or more of the stages in the receiver correctly.

Radios-on-a-chip and accompanying modulator-demodulators (modems) on a chip are now being promoted by several companies, e.g., Atheros Communications (Sunnyvale, Calif.) which markets its AR5000 chipset, as does the assignee of the present invention. Such chips put complete 5.15-5.35 GHz transceivers on a chip and complete COFDM modems on another chip, and these chipsets need only few external filters, a transmit/receive switch and a crystal to operate.

Many applications include stations that are battery operated, and for such applications, long battery life is highly important. Thus there is a desire to operate a modem chip at very low power levels.

Thus there is a need not only for rapid start-of-packet (SOP) detection and rapid automatic gain control. There also is a need to carry this out with relatively little power. In particular, there is a need for a method and circuit that achieves SOP detection and AGC compliant with the IEEE 802.11a and similar standards.

The need for rapid AGC has been acknowledged by others for other applications. For example, U.S. Pat. No. 5,524,009 to Tuutijarvi, et al., issued Jun. 4, 1996, deals with mobile communication, e.g., cellular communication, and in particular, with a method and means in such communication systems for providing a shorter handoff time at a mobile station, and for providing an improved gain control value for the receiver at a mobile station. U.S. Pat. No. 5,524,009 describes an AGC method that uses received signal strength determination over a period of about 5 ms. Packets that conform to the IEEE 801.11b standard for data communication in the 2 GHz range at up to 10 Mbits/second, in contrast, include a 64 μs preamble. The IEEE 802.11a standard for data communication in the 5 GHz range at up to 54 Mbits/second, in contrast, has packets with a short preamble and a long preamble that are each only 8 μs long, and AGC should be complete with about half the short symbols remaining. Thus, by rapid IEEE 802.11a AGC is meant AGC in sufficient time to meet the IEEE 802.11a standard.

Prior art AGC techniques that are required to be very fast—a time measured by microseconds or tens of microseconds—have used relatively inaccurate methods. One, for example, starts with a high gain value that causes the analog-to-digital converter for the received signal to overload, and decrease the gain or gains until no overload occurs. This is not only relatively inaccurate, but also requires the ADCs to operate, drawing a lot of power, and requires the ADCs to be overloaded.

One of the goals of AGC in a system is to adjust the gains of the radios to provide maximum dynamic range at the inputs of the analog-to-digital converters. The requirements are quite stringent for a system that conforms to the IEEE 802.11a standard. For example, if the received signal has a level between −62 dBm and −82 dBm at the receiver input, the SOP detection needs to occur within 4 µs with a probability of at least 90%.

Thus there is a need for a relatively accurate, relatively fast, and relatively low power SOP detection method, in particular, one conforming to the IEEE 802.11a and similar standards.

For more information on the IEEE 802.11 and IEEE 802.11a standards, see: ANSI/IEEE Std 802.11, 1999 Edition (ISO/IEC 8802-11:1999) Local and metropolitan area networks—Specific Requirements—Part 11: Wireless LAN Medium Access Control (MAC) and Physical Layer (PHY) Specifications, and IEEE Std 802.11a-1999 [ISO/IEC 8802-11:1999/Amd 1:2000(E)] (Supplement to IEEE Std 802.11, 1999 Edition) Part 11: Wireless LAN Medium Access Control (MAC) and Physical Layer (PHY) specifications: High-speed Physical Layer in the 5 GHz Band. The standards are available on the Internet at several locations, including from the IEEE (www.IEEE.org) and in particular at http://grouper.ieee.org/groups/802/11/index.html.

SUMMARY

Described herein is a digital AGC system for burst operation, particularly suited for receiving packets in a wireless local area network. One embodiment includes a log detector that provides a signal strength measure, called the received signal strength indication (RSSI) over a wide dynamic range. The AGC system includes optimum estimating of the power in a received signal by averaging the log of the signal power.

In one embodiment, the AGC system includes variable default gain setting. The gain can be set for any radio, or adjusted for temperature, process variation etc, so as to always get a desirable RSSI signal according to some criterion, e.g., wide dynamic range, low noise figure, and so forth.

Also disclosed is a method and apparatus for detecting the start of packet (SOP). In one embodiment, at least two RSSI filters, one having a longer filter length than the other are used. SOP detection in one embodiment is based on an absolute level or in another embodiment, on a rise in RSSI. In one embodiment, the SOP location is indicated by the point of maximum difference between the shorter and longer filters. A particular embodiment uses three filters, a short term, long term, and quiescent filter. The SOP location is provided by the point of maximum difference between the long term and quiescent filters One embodiment uses AGC lookup tables to control amplifiers/attenuator blocks in a radio receiver. Given a signal strength measurement, these pre-computed lookup tables map the signal strength measurement into appropriate radio gain control bits to maximize signal-to-noise-plus-distortion at each stage in the radio receiver. Using such lookup tables provides flexibility; different tables may be used when there are temperature changes, process variations, and so forth.

One embodiment further includes a mechanism for AGC restart. When the receiver false alarms on noise or a weak packet from a distant, co-channel interferer, then a much stronger packet arrives from a desired transmitter, one embodiment includes a method to detect such a situation, abort the current packet and restart the AGC process on this stronger packet.

DETAILED DESCRIPTION

Figure 1:
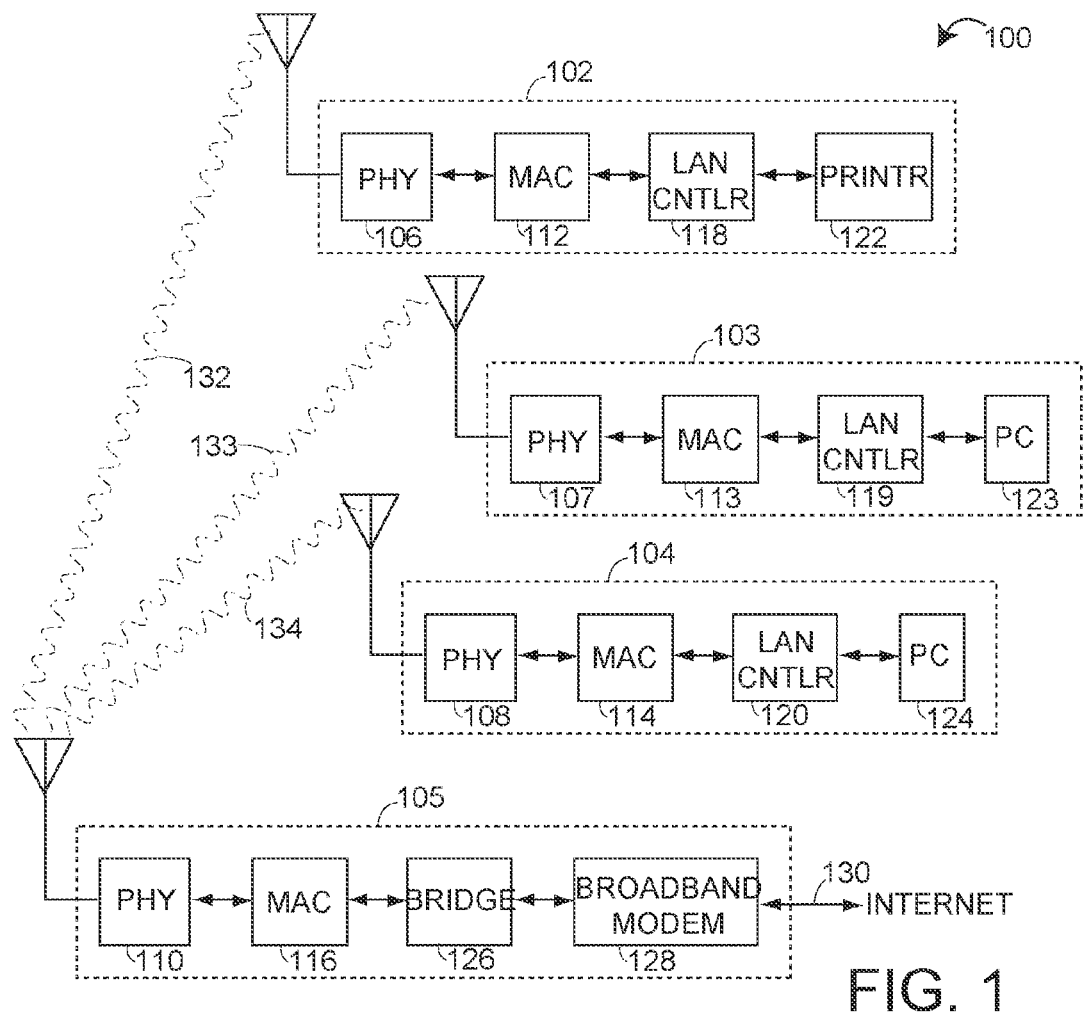
FIG. 1 is a functional block diagram of a wireless communication system embodiment of the present invention.

FIG. 1 diagrams a wireless computer data network in which embodiments of the present invention may be used, and is referred to herein by the general reference numeral 100. The network 100 includes a plurality of wireless appliances represented by units 102, 103 and 104, and may also include at least one base station connected to the Internet, e.g., represented here by a base station 105. One or more of the wireless appliances may be mobile. Network 100 preferably operates according to industry networking standards. For example, the IEEE-802 standard defines protocols for two types of networks, ad-hoc and client/server networks. An ad-hoc network is a simple network where communications are established between multiple stations in a given coverage area without the use of an access point or server. Such standard specifies the etiquette that each station must observe so that they all have fair access to the wireless medium, and provides methods for arbitrating requests to use the medium to ensure that throughput is maximized for all of the users in the base service set. The client/server network, e.g., in PCF (Point Control Function) mode, uses an access point for allocating the transmit time for all stations and it allows mobile stations to roam from cell to cell. The access point is used to handle traffic from the mobile radio to the wired or wireless backbone of the client/server network. This arrangement allows for point coordination of all of the stations in the basic service area and ensures proper handling of the data traffic. The access point routes data between the stations and other wireless stations or to and from the network server. Typically wireless local area networks (WLANs) controlled by a central access point will provide better throughput performance.

The license-free national information structure (U-NII) radio spectrum bands in the United States are assigned to 5.15-5.25, 5.25-5.35, and 5.725-5.825 GHz, and are preferred for use in the network 100 for wireless ad-hoc LAN communication. The IEEE-802.11a protocol includes a training sequence built on a preamble that provides sufficient information to allow frequency and timing estimation as well as channel estimation to enable a receiver to lock-on to the carrier and allow data demodulation. All transmissions occur in bursts, so the receivers must lock each time a burst commences.

A physical layer interface (PHY) 106, 107, 108, and 110, provides each of the wireless interconnections. A media access controller (MAC) 112, 113, 114, and 116, provides the next interface layer in a layered communications model. A local area network controller 118, 119, and 120 is provided as a peripheral to a personal computer (PC) 123, 124 and, in this example, a printer 122. The PCs can be computer workstations and laptops that belong to employees in a business environment, and even to individuals in their homes. In one application, the base station 105 is installed in a hotel and the other units 103 and 104 are independent guests who have checked-in and are allowed to access the Internet as part of their room charges. Unit 102 can be a printer. Other applications include inventory control, shipment tracking, immediate-area advertising, security access, night-watchman station checking, weapons stockpile verification, etc.

A bridge 126 interfaces the local area network through a broadband modem 128 to the Internet 130. The broadband modem 128 can be implemented with DSL, ISDN, or even two-way satellite connections like Starband (www.starband.com).

A plurality of radio communications, represented by radio links 132, 133, and 134, preferably use forty-eight active tones and four pilot tones in a 64-tone FFT coded orthogonal frequency division multiplexing (COFDM), and quadrature phase shift keying (QPSK). The modulated signals are transmitted in the five-GHz frequency band. Other modes can also be used, e.g., 16QAM and 64QAM. Such are described in detail in the IEEE-802.11a standard (www.ieee.com). Note there also may be direct radio links between the units 122, 123, and 124.

Figure 2:
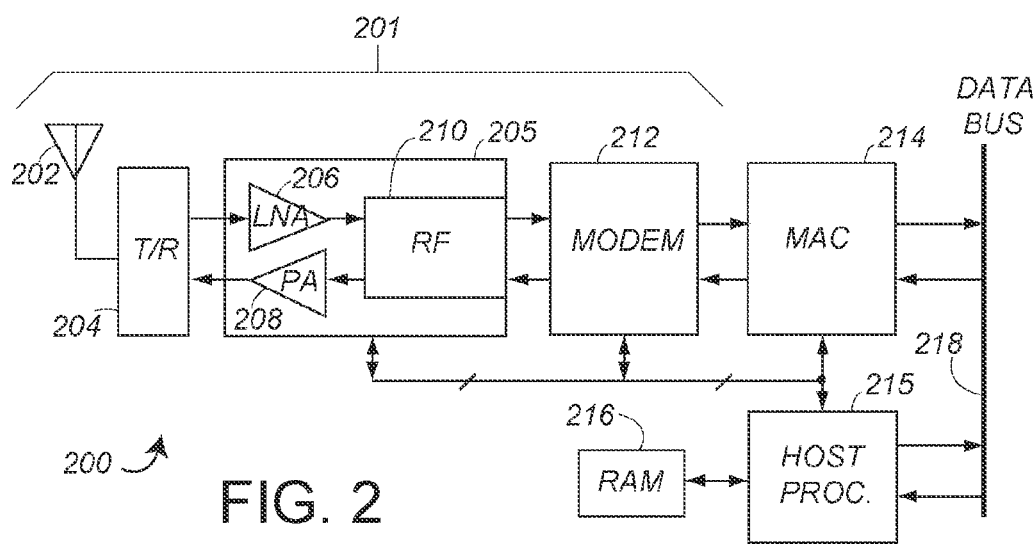
FIG. 2 is a functional block diagram of a wireless communication system 200 that includes an embodiment of the present invention.

FIG. 2 is a functional block diagram of a wireless communication system 200 that includes an embodiment of the present invention. The system 200 might be, for example, part of a PCMCIA wireless LAN card embodiment, and includes a physical layer interface (PHY) 201 that includes at least one antenna 202 for 5 G Hz carrier service, a transmit/receive (T/R) switch 204 for half-duplex operation, and a wireless transceiver 205 such as that of FIG. 2 or FIG. 4 that includes a low-noise amplifier (LNA) 206, a power amplifier (PA) 208, and other radio frequency (RF) transceiver components as described herein. The physical layer also includes a data modem 212. The system 200 further includes a media access controller (MAC) 214 for layer-2 processing. A computer system databus 218 is accommodated. Interfaces may be included e.g., one or more interfaces that conform to well-known industry standards PCM-CIA, PCI, USB, and so forth.

One optional component is a host processor 215. The host processor function may, for example be incorporated with the MAC 214. A random access memory (RAM) 216 is included for data buffering and program storage. The RAM 216 may be directly coupled to the host or to the MAC or to both.

In addition to the radio data between the modem, radio transceiver, and MAC, control information such as gain settings for the radio receiver from an automatic gain control module in the modem, and other data, may be communicated between the host (if included), the MAC, the modem and the wireless transceiver.

Antenna diversity is preferred in some applications, e.g., two or more transmit antennas or two or more receive antennas or multiple antennas for both the receive and transmit mode. Diversity combining will also help in signal-fading environments.

The system 200 is preferably implemented to be compatible with the IEEE-802.11a standard for wireless local area network (LAN) applications. The RF transceiver 210 and modem 212 constitute a complete wireless engine for OSI Layer-1 physical layer (PHY) functionality in broadband wireless LAN's. The (MAC) 214 is IEEE-802.11-compliant for layer-2 processing. Supportable data rates have been tested to exceed 54 Mbits/second.

Given the present state of semiconductor technology development, the system 200 is preferably constructed on a single printed circuit board (PCB) and the RF transceiver 210 and modem 212 are each implemented with CMOS technology in individual integrated circuits. The present inventors have discovered that 0.25-micron CMOS technology is practical for use in implementations of the modem 212, and 0.18-micron CMOS technology for the RF transceiver 210. One such silicon foundry that has the capability to manufacture such parts is Taiwan Semiconductor Manufacturing Co., Ltd.

The Modem Chip

Figure 3:
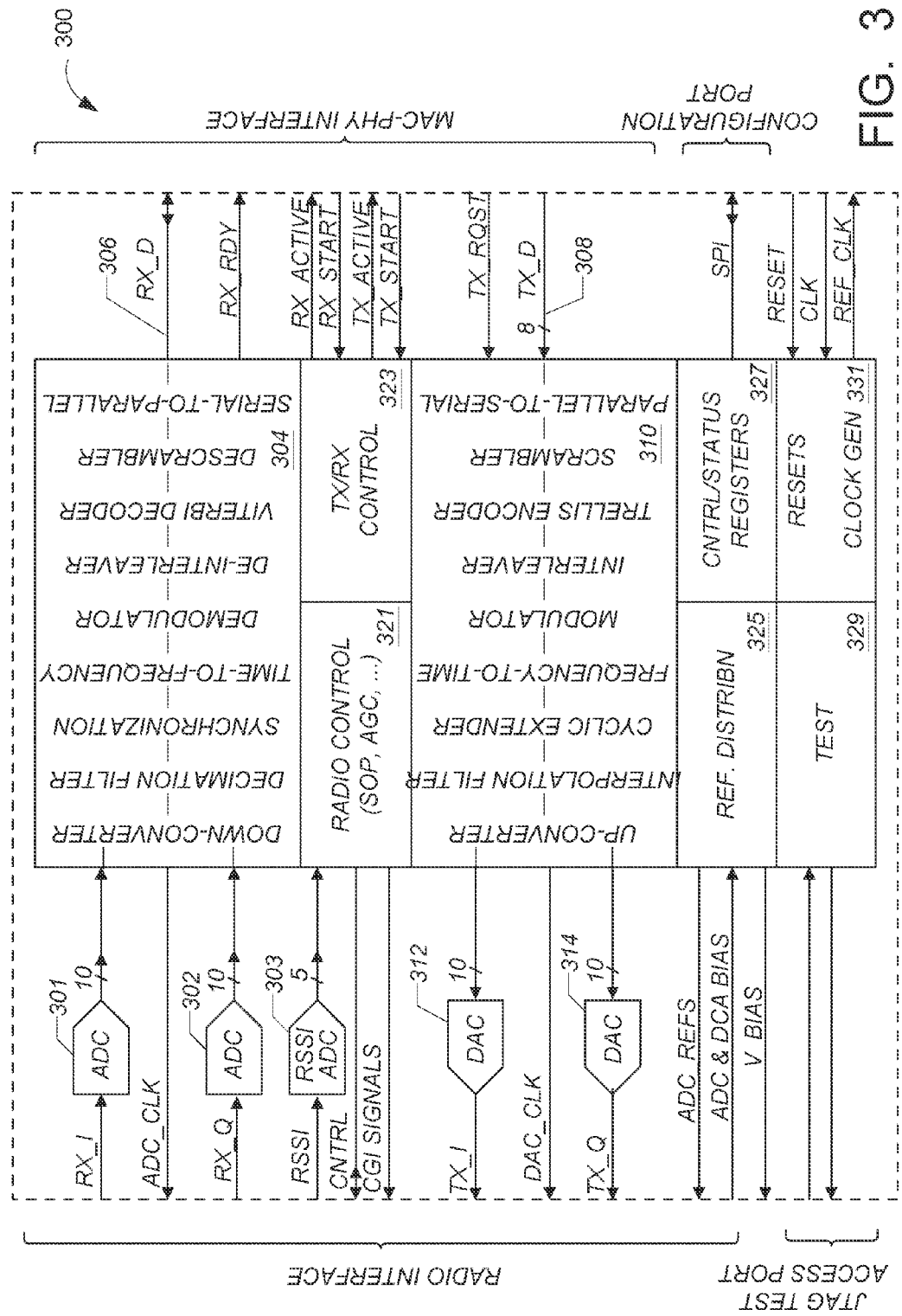
FIG. 3 shows a block diagram of a modem integrated circuit that includes an embodiment of the present invention.

FIG. 3 shows in simplified block diagram form, an embodiment 300 of the modem chip that can operate with the transceiver chip. ADCs 301 and 302 accept fully differential I and Q analog signals from one embodiment of the transceiver chip, or one of the ADCs accepts a single differential signal from a single sideband embodiment of the transceiver chip. The receive signal processor 304 accepts the digitized receive signals from ADCs 301 and 302 and carries out the following operations: down-conversion, anti-alias filtering, OFDM carrier and symbol synchronization, time-to-frequency conversion, pilot tracking, sub-carrier demodulation, de-interleaving, Viterbi decoding, descrambling, and serial-to-parallel conversion. The output 306 of the receive processor 304 goes to an off-chip MAC processor.

The receive input of modem 300 can interface to two basic receiver configurations.

1. A quadrature radio receiver with baseband I and Q differential outputs which are sampled at 40 Ms/s by the ADCs. In such a case the ADC outputs are filtered by 2:1 decimating filters in the receiver signal processor 304.
2. A bandpass IF radio receiver with real bandpass IF differential output centered at 20 MHz. The analog input from the transceiver chip is sampled at 80 Ms/s by one ADC and an internal IQ down-converter in processor 304 generates baseband I and Q channel outputs. The decimating filters are configured as a 4:1 decimating low-pass filters.

In one embodiment, the transmit and receive data paths in modem 300 are completely independent, allowing full duplex as well as half-duplex operation.

Note that another embodiment of the modem chip is only for implementation with a bandpass IF radio receiver, so that only a single differential ADC, rather than the two ADCs 301 and 302 shown in FIG. 3 is included for the receive path. The analog input from the transceiver chip is sampled at 80 Ms/s by that ADC and an internal IQ down-converter in processor 304 generates baseband I and Q channel outputs. The decimating filters are configured as a 4:1 decimating low-pass filters.

The to be transmitted signal 308 from the MAC is input to a transmit processor 310 that performs parallel-to-serial conversion, scrambling, encoding, bit-interleaving, sub-carrier modulation, pilot insertion, OFDM time symbol generation, cyclic extension, filtering and up-conversion. The resulting digital signals are converted to analog I-and Q-signals by digital-to-analog converters 312 and 314. These analog signals are input to the transceiver chip.

The architecture shown in FIG. 3 supports all the raw data rates and modulation schemes specified by IEEE 802.11a, mandatory and optional, plus three additional proprietary configurations.

In one embodiment, operation of the modem 300 is controlled and monitored by a set of control and status registers that, in one embodiment, are 16-bits each and accessed via a 4-pin Serial Peripheral Interface (modem SPI).

The radio receiver is controlled by radio control block 321 that includes the inventive start-of-packet (SOP) detection and automatic gain control (AGC) for dynamically setting the gains and the performance of the transceiver. The receive and transmit functions of the modem are controlled by an TX/RX control block 323 that both provides controlling the function of the modem under control of the off-chip MAC controller and that provides status signals to the off-chip MAC controller.

The modem also includes a modem gain control interface (modem GCI) in radio control 321 that outputs gain parameters to a radio receiver. The gain control interface is a serial transmit-only port for setting gains, used, for example to dynamically adjust transceiver receive path gain to optimize the received signal to noise and distortion ratio. In one embodiment, the GCI also provides a mechanism for controlling the transmit power level of a radio transmitter connected to the modem by selecting from one of nine configurations for the power amplifier of the transmitter. One embodiment of the radio transceiver also includes a transceiver gain control interface (transceiver GCI). How the modem GCI functions with the transceiver GCI is described below, in the transceiver chip subsection.

In order to keep the power consumption of the modem chip low, the analog to digital converters are only kept on when necessary. There thus are RUN/STANDBY signals for each of the ADCs 301 and 302. Furthermore, there are controlled bias circuits for the analog components of the modem chip that provide for switching bias currents on and off from different subsections of the modem chip, and that also provide for switching the bias current from a first level to a second level.

The AGC functions of the modem of FIG. 3 are controlled by several finite state machines (FSMs). In one embodiment, a 16-bit microcontroller also is included. The microcontroller is called the RAD16 herein, and is of essentially the same design as a RAD16 microcontroller in the transceiver. The RAD16 is described further below in the description of the transceiver.

The Radio Transceiver Chip

Figure 4:
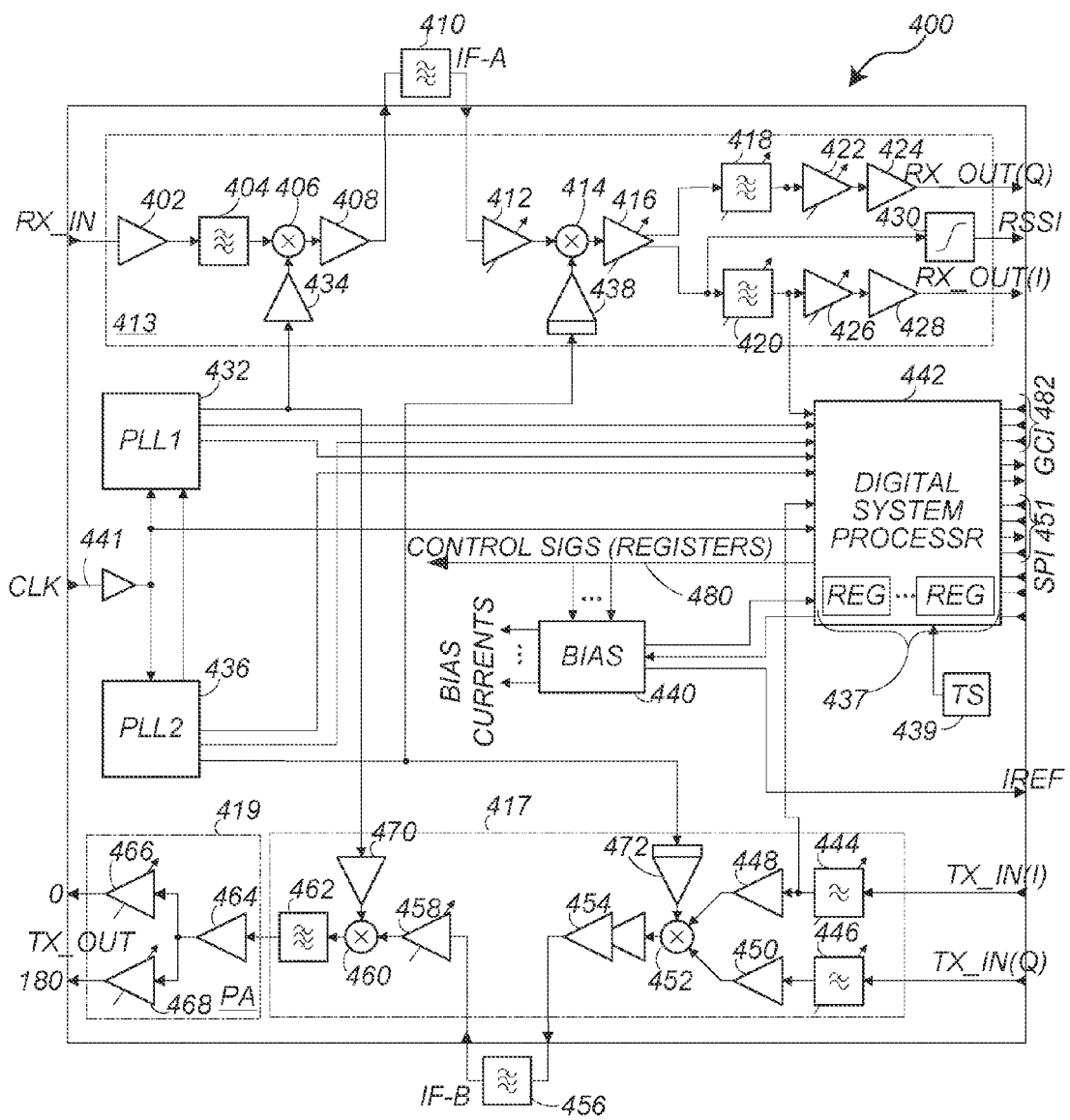
FIG. 4 shows a two-stage superheterodyne transceiver that includes a bias supply and a digital system controller.

FIG. 4 shows a radio transceiver monolithic integrated circuit 400 that includes a substrate and first set of analog subcircuits on the substrate forming a receiver subsystem 413 and a second set of analog subcircuits on the substrate forming a transmitter subsystem. The transmitter subsystem further includes a transmitter front-end 417 and a power amplifier subsystem 419.

In order not to unnecessarily obscure the present invention, various well-known structures and interfaces, secondary to the understanding of the invention, are not shown in the chip architecture of FIG. 4.

The receiver subsystem 413 and transmitter front-end 417 are each in a two-stage superheterodyne configuration that includes two mixers requiring two oscillator signals. PLL1 (432) and PLL2 (436) are on-chip oscillators—e.g., phase-locked loop synthesizers—that generate local oscillator signals for the two mixers that are included in each of receiver subsystem 413 and transmitter front-end 417. In one embodiment, each of PLL1 and PLL2 includes a voltage-controlled oscillator (VCO) and a phase error detector.

In one embodiment, one or more intermediate frequency (IF) filters for the receiver subsystem 413 and for the transmitter front-end 417 are off-chip. The oscillators 432 and 436 are on-chip. In one embodiment, transceiver 400 is for half-duplex operation with mutually exclusive receive and transmit periods. In one implementation, transceiver 400 is for operation in a WLAN, for example a WLAN conforming to the IEEE 802.11 medium access control (MAC) specification, and in particular, a WLAN conforming to the 802.11a WLAN specification.

The transceiver embodiment 400 includes a bias supply 440 to supply bias to the various subcircuits, and digital system processor 442. In one embodiment, the bias supply 440 is programmable, and controlled by digital system processor 442. Processor 442 is a digital circuit that in one embodiment is on the same substrate as the receiver subsystem 413 and transmitter 417, and that includes one or more—say N—registers 437, a microcontroller called the RAD16 herein, and a system processor interface (transceiver SPI) 451. The transceiver SPI, also referred to as the transceiver configuration port, provides access to the registers 437, and in one embodiment, is a serial port. The digital system processor 442 provides a set of bias control signals to the bias supply. In one embodiment, the bias supply 440 includes a main bias generator that provides bias currents in units that are defined by an external reference resistor $R_{REF}$. Selecting different values for $R_{REF}$ is one way of providing for different power levels.

Radio transceiver 400 is substantially monolithic and in one embodiment, includes metal oxide semiconductor (MOS) circuitry, including CMOS analog and digital circuitry. In one embodiment, the analog subcircuits are CMOS subcircuits that operate at RF frequencies in the 3 to 5 GHz range and baseband frequencies up to 40 MHz. "Baseband" refers to the low-frequency input and output frequency bands, and includes bandpass IF signals. In one embodiment, the integrated circuit also includes digital subcircuits to provide control, status, and interface logic, including digital system processor 442.

The major analog subcircuits include the transmitter front-end 417, the power amplifier subsystem 419, the receiver subsystem 413, and the phase-locked loop (PLL) based synthesizers 432 and 436 that generate the local oscillator signals for a pair of mixers included in each of the receiver subsystem 413 and the transmit front-end 417. One embodiment of the transceiver chip includes an analog to digital converter (ADC) (not shown in FIG. 4) and a set of one or more digital-to-analog converters (DACs—also not shown in FIG. 4) that are used for test purposes. A temperature sensor 439 also is included.

In one embodiment, the same intermediate frequency is used in both the transmit front-end and the receiver subsystems.

In one embodiment, the digital portion of the integrated circuit includes digital system processor 442 that includes control and status registers 437, a serial configuration port (transceiver SPI 451) that provides external access to the registers and that provides for on-the-fly adjustment of such parameters as the gains of some of the transmit and receive amplifiers and adjustment of the bias current generation parameters. The digital portion of the integrated circuit may further include PLL lock-detect filters, ADC and DAC control logic, and clock generation logic.

The embodiment shown in FIG. 4 includes a transmitter front-end 417 that provides for quadrature (I and Q) input transmit signals, that, in one version, are differential signals. The receiver subsystem 413 includes quadrature (I and Q) baseband receive (output) signals that, in one version, are differential signals. In another embodiment, the receiver subsystem 413 includes a single baseband (SSB) receive signal output rather than quadrature receive signals, and such an embodiment is similar to that shown in FIG. 4, but with only a single output generated internally from the I and Q.

In one embodiment, the I-and Q-channel transmit input signals are filtered by tunable lowpass filters 444, 446. Amplifiers 448, 450 buffer the lowpass filter outputs and drive the baseband inputs of an intermediate frequency (IF) up-converter 452. The oscillator input of the up-converter 452 is driven by the output—in one embodiment, 580-880 MHz—from a quadrature oscillator-signal generator 472. The signal generator 472 generates the quadrature oscillator signal by dividing the synthesizer PLL2 (436) output—in one embodiment, 2.32-3.52 GHz—by 4. In one embodiment, the IF up-converter 452 contains a quadrature mixer and a filter to reject high-order mixer image products. The up-converter 452 drives a preamplifier and IF output buffer 454. The output buffer 454 drives an external IF filter (IF-B, 456).

The output of the external IF filter 456 feeds an IF input variable gain amplifier (VGA) 458. In one implementation, the gain of VGA 458 is adjustable using parameters entered via a transceiver gain control interface (transceiver GCI) 482. The VGA 458 drives the IF input of an RF up-converter 460. The oscillator input of the RF up-converter 460 is driven by the output signal—in one embodiment, 4.41-4.55 GHz—of synthesizer PLL1 432 after buffering by a buffer amplifier 470. In one embodiment, the RF up-converter 460 contains a mixer and includes a filter to reject unwanted mixer image products. The up-converter 460 is followed by an RF bandpass filter 462 that further suppresses unwanted images. The output of filter 462 drives a RF power amplifier driver 464 that in turn drives the power amplifier subsystem 419. In one embodiment, two power amplifiers, 466 and 468, are included in the power amplifier subsystem 419 to produce complementary output signals in the frequency range 5.15-5.35 GHz. The two power amplifiers each have independent bias current control so that if a single-ended output only is required, one of the power amplifiers can be turned off to conserve power. In one embodiment, the gain of the power amplifiers 466, 468 is adjustable using parameters entered via the transceiver SPI 451.

One embodiment of the receiver subsystem 413 is now described in more detail. The input to the receiver subsystem drives a differential-input RF low-noise amplifier (LNA) 402. In one embodiment, LNA 402 operates over an input frequency range of 5.15-5.35 GHz. In one embodiment, bypassing the LNA 402 is possible by setting a bit entered via the transceiver SPI 451, and such bypassing reduces the receive gain. The LNA 402 is followed by an integrated image reject filter 404 that feeds the RF input of a down-converter 406. The oscillator signal from synthesizer PLL1 432 is buffered by a buffer amplifier 434 before being fed to the oscillator input of the RF down-converter 406. In one embodiment, the RF down-converter contains a relatively highly linear double-balanced mixer, a filter and an IF output preamplifier. The down-converter 406 is followed by an IF output buffer 408. The buffer 408 drives an external IF filter IF-A (410).

In one embodiment used with an intermediate frequency range of 300-900 MHz (PLL1 frequency of 4.41-4.55 GHz), for relatively high performance applications, the external IF filter 410 is a surface acoustic wave (SAW) device. In other less-demanding applications, a relatively simple LC filter may be used for IF filter 410.

The output of the external IF filter 410 feeds an IF input VGA 412, whose gain is adjustable using parameters input via the transceiver GCI 482. The IF VGA 412 feeds the IF input of a down-converter 414. The quadrature oscillator signal for the down converter 414—in one embodiment, 580-880 MHz—is generated by a quadrature signal generator 438 by dividing the synthesizer PLL2 (436) output—in one embodiment, 2.32-3.52 GHz—by four. In one embodiment, the IF down-converter 414 contains a quadrature mixer that generates in-phase (I) and quadrature-phase (Q) output signals. In one embodiment, a single baseband output preamplifier is provided for the I output. In another embodiment shown in FIG. 4, a preamplifier is provided for both the I and Q outputs.

The IF down-converter I and Q outputs feed a baseband coarse-step VGA pair 416. The gains of the coarse-step VGAs are adjustable in relatively coarse steps using parameters entered via the transceiver GCI 482. The coarse-step VGAs 416 drive tunable filters 420 and 418. In a single-sideband embodiment, only the filter 420 is provided for the single output, and the filter 420 is a bandpass filter, 10-30 MHz in one embodiment. In another embodiment, tunable filters 420 and 418 are lowpass filters, 0-20 MHz in one version. Filters 420 and 418 provide further rejection of mixer image products and, in one embodiment, may be bypassed by setting a bit entered via the transceiver SPI 451.

The outputs of the filters 420, 418 drive fine-step VGAs 426 and 422, each of which in turn drives one of output buffers 428 and 424. The gains of the fine-step VGAs 426, 422 are adjustable in relatively fine steps via parameters entered via the transceiver SPI 451.

The I-channel coarse-step VGA 416 also drives a logarithmic detector/amplifier 430. The logarithmic detector allows received signal strength indication (RSSI) measurements to be made.

The set 437 of registers in system processor 442 includes phase lock loop (PLL) main divider registers, phase locked loop (PLL) tuning registers, PLL charge pump registers, PLL control registers, PLL reference divider registers, PLL lock filter registers, and PLL lock detect registers. These PLL registers are used to control and tune PLL1 432 and PLL2 436, and to detect lock conditions.

The set 437 of registers in system processor 442 also includes:

A receiver baseband filter tuning register for tuning filters 418 and 420.

A receiver baseband filter control register for selecting, bypassing and resetting filers 418 and 420 and for selecting the common mode voltage for the baseband components in the receiver subsystem 415.

A receiver gain control register for bypassing or not the LNA 402 and setting the gains of IF amplifier 412, and coarse and fine step variable gain amplifiers 422,426 and 424, 428, respectively.

A transmitter baseband filter tuning register for tuning transmit baseband filters 444 and 446.

A transmitter baseband filter control register for selecting, bypassing and resetting filters 444 and 446 and for selecting the common mode voltage for the baseband components in the transmit front end 417

A transmitter gain control register for setting the gains of the IF amplifier 458 and the power amplifiers 466 and 468.

The set 437 of registers in system processor 442 further includes:

Status registers

Ramp generator registers for setting the characteristics of the modulation of the receiver and transmitter turn-on and turn-off bias current modulation.

ADC registers

IDAC and QDAC registers

CDAC registers

Power amplifier mode registers that include a three bits power mode select value for selecting the mode, and 8 sets of power amplifier bias controls, one for each of eight power amplifier modes that are selected according to the value of the power mode select value.

Bias control registers for setting the bias of subcircuits in the transceiver.

Processor control and interrupt registers for defining the start address for the RAD16 microcontroller in processor 422 and for enabling interrupts, for providing branch addresses for interrupts and for selecting how interrupts are sensed. One of the interrupt conditions is an ADC flag that sets an interrupt when a signal called comp_out is set. Signal comp_out is set when the analog input supplied to the ADC is greater than some digital value, e.g., some estimate, otherwise signal comp_out is not set.

Processor registers for the RAD16 microcontroller such as an accumulator, a program counter, an address register, a data output register, a data input register, an instruction register, data read/write memory (RAM) and instruction RAM, and instruction ROM.

The transceiver gain control interface (transceiver GCI) 482 inputs gain parameters to the digital system processor 442. The gain control interface 482 is a serial receive-only port for setting gains, used, for example, by the receive path automatic gain control logic in a radio controller (MODEM) (such as the R-M11a modem described in above-mentioned incorporated by reference provisional patent application Ser. No. 60/277,370 (The First Parent Application) to dynamically adjust transceiver receive path gain in order to optimize the received signal to noise ratio. The GCI 482 also provides a mechanism for controlling the transceiver transmit power level by selecting from one of nine configurations for the power amplifier subsystem 419. The three inputs in the GCI 482 are GCI_CSn, a gain control port chip select input, GCI_CLK, a gain control port clock, and GCI_DATA, the gain control port data input.

The GCI data is loaded into one of three further registers included in the transceiver: the GCI receiver register, the GCI transmitter gain register, or the GCI PA mode register. These registers control the variable gain blocks in the transmit and receive paths when a GCI enable bit is set. Otherwise, the registers set the signal path gains.

A control bus 480 is used to communicate control signals from the registers in register set 437 in the digital system processor 442 to various subcircuits of the transceiver for the purpose of setting several characteristics of the transceiver. In one embodiment, the control bus is used to send control signals to the programmable bias supply 440. The control bus 480 is further used to set the gains of receiver amplifiers 412, 422 and 426, and to switch in or out the receiver LNA 402. The control bus 480 is also used to send signals from the system processor to set the gains of transmitter amplifier 458 and the power amplifiers 466 and 468. Furthermore, the control bus 480 is also used to send signals from the system processor to set the characteristics of filters 418 and 420 on the receiver side and 444 and 446 on the transmitter side.

According to one embodiment, the RAD16 microcontroller of processor 442 includes a RAM for instructions, a RAM for data, and a ROM for instructions. One embodiment of the processor in 442 is a 16-bit accumulator-based processor. The instruction set for the RAD16 microcontroller includes arithmetic instructions, logical instructions, shift instructions, bit set and test instructions, load instructions, store instructions, memory instructions, jump instructions, return instructions, and some other instructions.

The AGC Module

The AGC module of the modem of FIG. 3 is part of the radio control module 321. Signals to control the gain elements of a radio receiver such as that in the transceiver of FIG. 4 are sent via an interface that matches the transceiver of FIG. 4.

The AGC module is responsible for:

Setting the radio receiver's gains to default values suitable for detecting packets having a broad range of signal strengths.

Determining whether a packet is present and providing an estimate of when the packet started, i.e., SOP detection and SOP time determination.

Setting the radio receiver's gain. In one embodiment, this is done in two stages. First the coarse gain is set to a suitable value for receiving the current packet, i.e., to bring the signals within range of the analog-to-digital converters. In one embodiment, the analog-to-digital converters are in a low-power standby state until this point—e.g., turned off—to save power. The ADCs are then turned on and used to digitize the received signal, and from this, the AGC module refines the radio receiver's gain by a fine AGC stage.

Checking general properties of the received signal, and providing abort signals if its behavior is inconsistent with that of a genuine packet.

Figure 5:
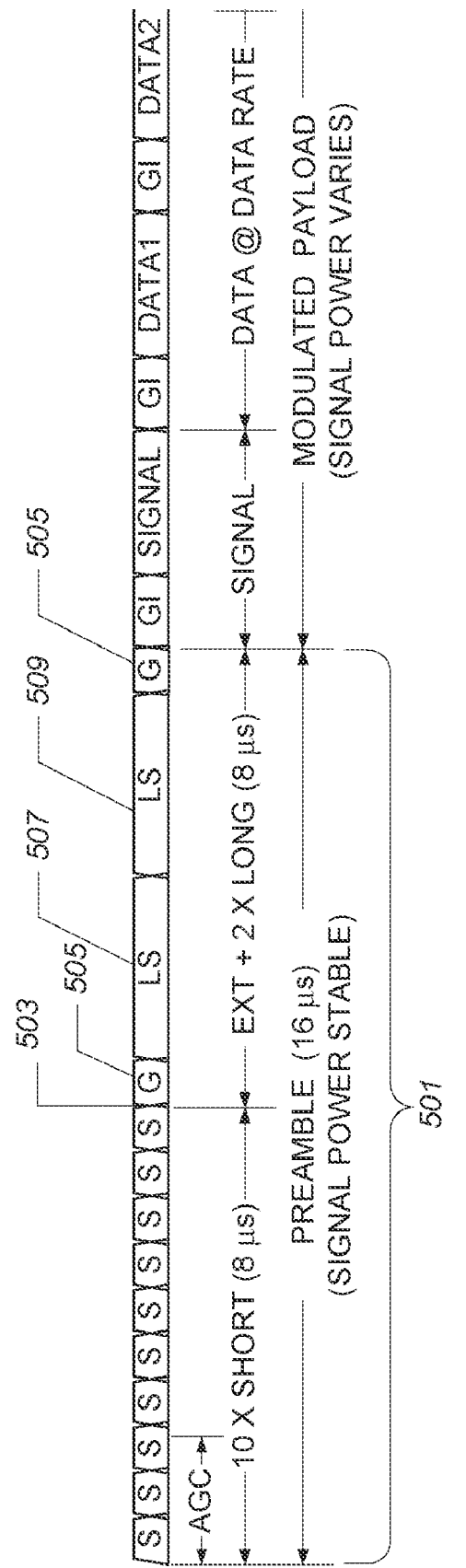
FIG. 5 shows a typical OFDM packet that conforms to the IEEE 802.11a standard and that includes a preamble with a short and a long preamble period that precede the signal payload.

FIG. 5 shows the structure of a OFDM packet as used in IEEE 802.11a WLANs. The packet starts with a preamble 501 used for SOP detection, AGC, diversity selection when diversity is used, and various other synchronization functions. The preamble is followed by the modulated payload, which starts with a known (low) data rate SIGNAL field and DATA fields. Each data field includes a guard interval (cyclic extension).

The preamble 501 is 16 µs long and has two 8 µs-long parts: a first part ("short preamble part") consisting of set of 10 short symbols, and a second part ("long preamble part") consisting of two long symbols and a cyclic extension part (guard interval). In a typical system, the short preamble part provides for SOP detection, AGC, diversity selection when diversity is used, coarse frequency offset estimation and timing synchronization. The long preamble part then provides for channel estimation and fine frequency offset estimation.

In order to provide enough time for further preamble processing, SOP detection needs to be detected within 2-4 µs, i.e., within 3-5 short symbols into the short preamble period. The exact SOP time also needs to be determined, but can be determined later than the detection of the SOP.

Figure 10:
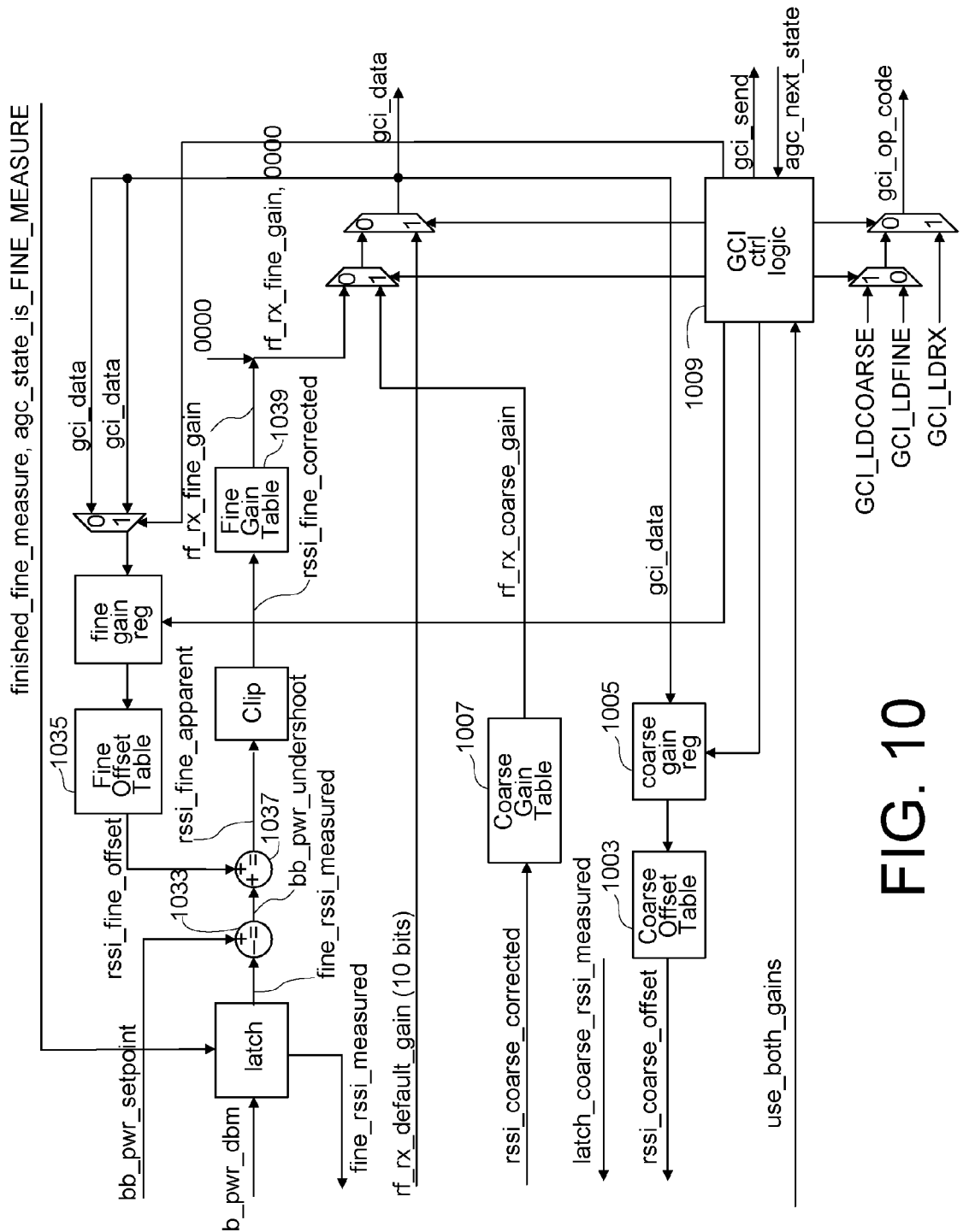
FIG. 10 shows the data path logic for coarse and fine AGC setting, showing the AGC lookup tables. Logic for writing the lookup tables is omitted in the drawing.

The AGC module and its environment are shown in FIG. 10. The AGC module is divided into control and data-path functions implemented by an AGC controller and an AGC data path. The AGC controller is implemented as a finite state machines (the AGC FSM) and monitors status bits and parameter values coming from the AGC data-path, then responds by starting or resetting elements within the AGC data-path, or by initiating a gain control interface (GCI) transaction, for example to transmit information to the transceiver GCI.

Figure 6:
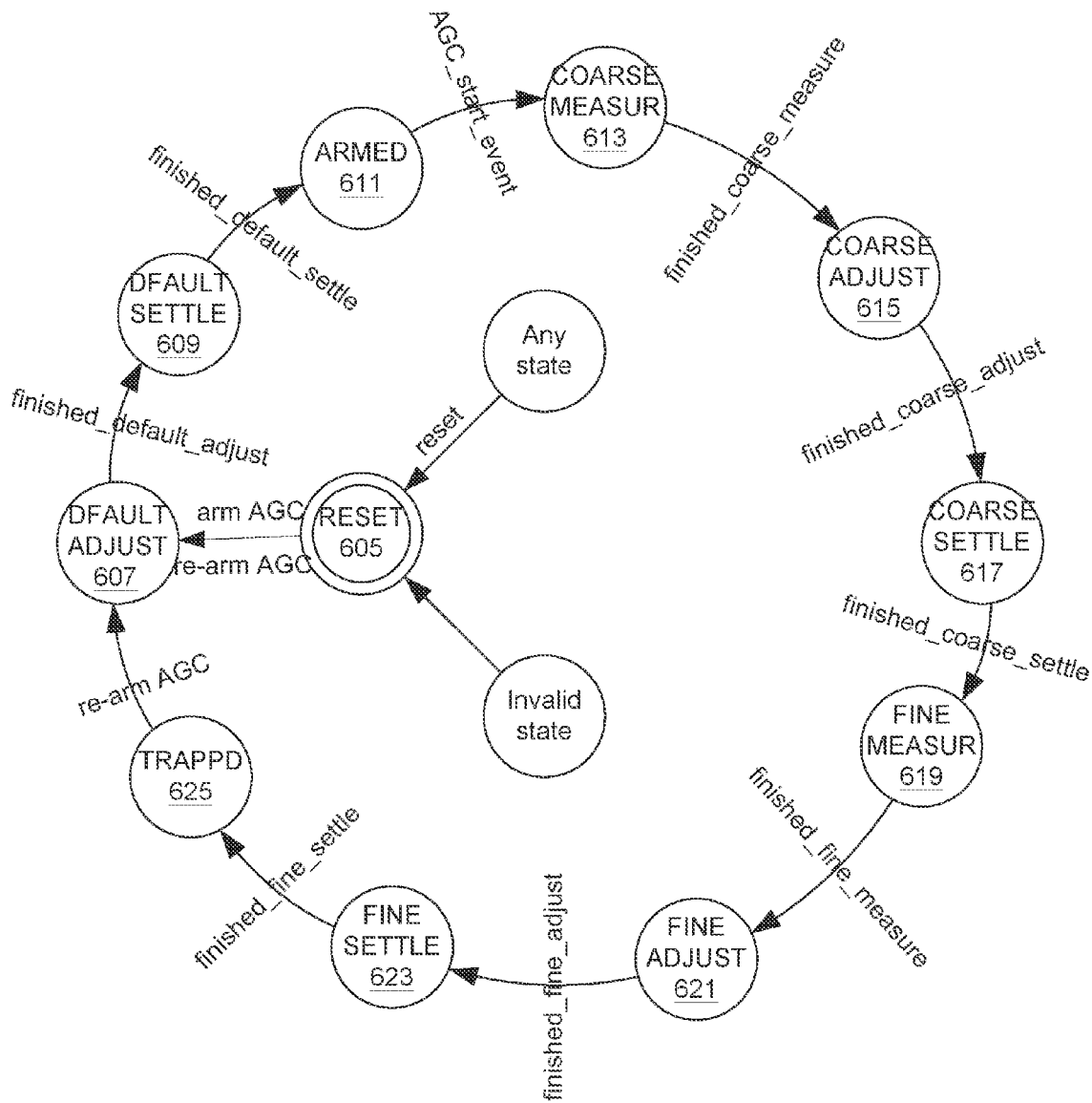
FIG. 6 shows a simplified state transition diagram for an AGC controller according to an embodiment of the invention.
Figure 7:
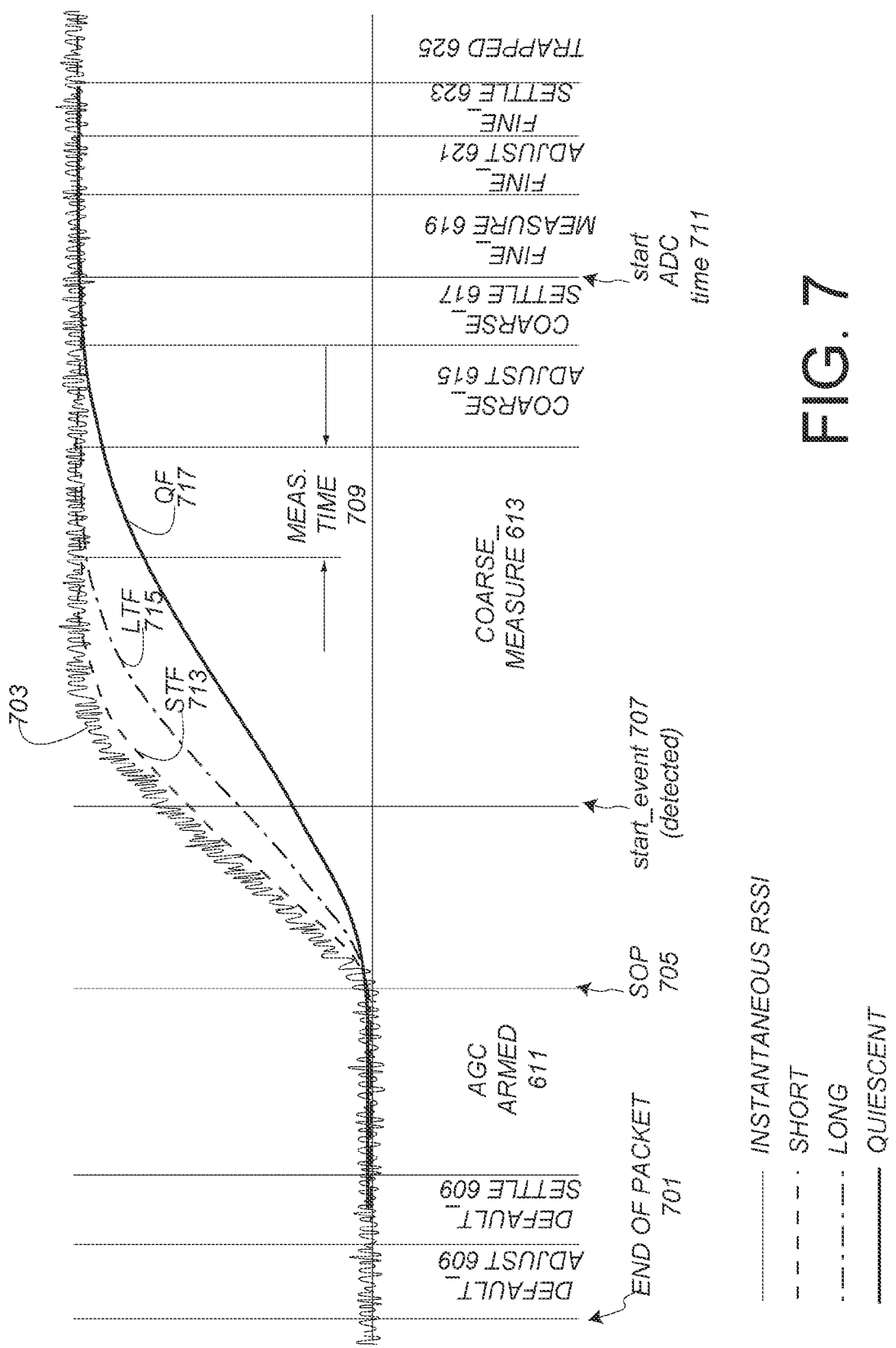
FIG. 7 shows a typical RSSI signal around the time of a SOP event and shows where some of the AGC controller states are in relation to the states and events of the state transition diagram of FIG. 6.

FIG. 6 shows a simplified state transition diagram for an AGC controller. FIG. 7 shows a typical RSSI signal 703 around the time of an SOP event and shows where some of the AGC controller states are in relation to the states and events of the state transition diagram of FIG. 6.

Referring to FIGS. 6 and 7, the idle state is called the RESET state 605. The next state occurs when an arm_agc or a rearm_agc signal is asserted, e.g., when the modem ceases responding to a false alarm as asserted by another state machine that controls the receiver modem functions, called the receiver FSM (RX FSM), at which point the AGC controller shifts to the states that set a default gain for the receiver. This occurs during the DEFAULT_ADJUST state 607 and DEFAULT_SETTLE state 609, when the modem commands the radio receiver to change its gains to a set of gain values called rx_default_gain, selected to allow packets having a broad range of signal strengths to be detected reliably. DEFAULT_ADJUST state 607 is when the AGC module hands over rx_default_gain to the modem GCI for transmission to the radio receiver, e.g., to the transceiver GCI 482. The AGC FSM transitions to DEFAULT_SETTLE state 609 once the modem GCI module has finished the transfer. After the radio receiver is commanded to change its gain, there may be a transient, and there will be a delay before the new gain is fully reflected in the RSSI-ADC 303 and I-ADC 301 outputs. The transients may be due, for example, to the SAW filter in the receiver, the receiver baseband filter and ADC latency. Thus DEFAULT_SETTLE 609 is a wait state, to ensure that any samples affected by the transient or the old gain are ignored. The wait duration is set by parameter default_settle_time.

After default_settle_time passes, the AGC controller passes to an ARMED state 611. At this point the AGC controller is ready to detect a start event. When in the ARMED state 611, when a packet starts, such as shown in FIG. 7, one or more methods for detecting the SOP 705 are used to detect a SOP. SOP determination is described in detail below.

Once the algorithms have detected that a packet may be present, the detection shown as start_event 707 in FIG. 7, the power is measured in order to coarsely set the radio receiver gains. The coarse AGC setting sequence is made up of three states: COARSE_MEASURE 613, COARSE_ADJUST 615 and COARSE_SETTLE 617.

The COARSE_MEASURE is a wait state. Its duration is specified by a value in the configuration register and called coarse_measure_time. Upon terminal count, the AGC FSM transitions to COARSE_ADJUST.

During this COARSE_MEASURE state, the received signal strength, rssi_coarse_apparent, is calculated as the average of the RSSI samples, less an offset in one embodiment. rssi_coarse_apparent is registered at the end of the COARSE_MEASURE state. The duration of the COARSE_MEASURE state is set so that the samples used to calculate the current average all lie within the packet. Measurements are taken within the COARSE_MEASURE state (shown as measure time 709 in FIG. 7) when the mechanism used to obtain the measurements is assumed to be accurate.

The COARSE_ADJUST state 615 is when the modem calculates the appropriate radio receiver gain control bits and then transfers them to the radio receiver. The registered rssi_coarse_apparent, now called coarse_rssi_measured is used to coarsely set the gain. A number of the most significant bits of rssi_coarse_apparent provide an address into a gain mapping memory containing a loadable lookup table, the Coarse-Gain-Table, which in one embodiment is a 32-entry 10-bit table. This table maps the measured signal strength into the appropriate radio receiver gain control bits. A high signal strength typically maps to a low radio receiver gain, and vice versa. The radio receiver gain control bits are prepended with an op-code then transferred to the radio receiver via the GCI.

One embodiment for operation with the transceiver chip of FIG. 4 provides for setting either only some of the variable gain amplifiers (VGAs) of the receiver, including the coarse gain VGA 416, or all the VGAs, including the fine gain VGA 422. Normally the gains are only coarsely set. The AGC FSM transitions to COARSE_SETTLE state 617 once the GCI module has finished the transfer.

After the radio receiver is commanded to coarsely change its gain, there may be a transient, and there will be a delay before the new gain is fully reflected in the ADC output. Thus COARSE_SETTLE is a wait state, to ensure that any samples affected by the transient or the old gain are ignored. The wait duration is set by a register whose value is called coarse_settle_time.

After the radio receiver gains are coarsely set, the signal level from the receiver should be in range for the modem chip's ADCs, e.g., the modem's I-ADC 301. If the ADCs were in a standby state, e.g., off, they are now turned on (time 711 in FIG. 7) so that they can be used to measure the received power more accurately than the RSSI measure. The next three states are for finely setting the gains of the radio receiver using measurements from either the I-ADC 301 or the I-and Q-ADCs. The states are FINE_MEASURE state 619, FINE_ADJUST state 621, and FINE_SETTLE state 623, and each of these state's functioning resembles that of the equivalent coarse AGC state.

FINE_MEASURE is a wait state. It lasts as long as it takes for the ADC power measurement to become valid. Once valid, the AGC FSM transitions to FINE_ADJUST. During FINE_MEASURE, the power into the ADC (or ADCs) is measured and averaged. FINE_ADJUST 621 is when the modem calculates the appropriate fine radio receiver gain control bits and then serially transfers them via the GCI to the radio receiver. In one embodiment, only the fine VGAs gain is set. As described in more detail below, a gain mapping memory containing another loadable lookup table, the "Fine-Gain-Table," is used to transform the average power measurement to the gain setting. The AGC FSM transitions to FINE_SETTLE state 623 once the modem's GCI module has finished the transfer.

After the radio receiver is commanded to change its fine gain, there may be a transient, and there will be a delay before the new gain is fully reflected in the ADC output. Thus FINE_SETTLE 623 is a wait state, to ensure that any samples affected by the transient or the old gain are ignored. The wait duration is set by the value of a register, fine_settle_time.

At the end of the settling time of state FINE_SETTLE 623, the coarse and fine gain setting stages are completed. This is normally about halfway through the short symbols at the beginning of a packet. At this stage, the radio receiver gain is trapped for the duration of the packet. The corresponding state is called TRAPPED state 625.

Next, under control of the AGC FSM, the AGC data-path checks general properties of the received signal. If its behavior is inconsistent with that of a genuine packet, then the AGC data-path or AGC FSM passes this information to another state machine, the receiver finite state machine (RX FSM), to selectably stop the receiver processing.

Either the end of a packet or a packet abortion is signaled to the AGC FSM by the RX FSM as an arm_AGC or re-arm_AGC signal. At this point, the AGC FSM reverts to the DEFAULT_ADJUST state to set the radio receiver gain to its default value.

The embodiments described herein are able to achieve the TRAPPED state 625 well within the short preamble time, i.e., within 8 μs. Note that this TRAPPED state 625 may be reached in some embodiments prior to determination of the exact SOP time. Some delay is permitted in SOP time determination.

SOP Determination

One aspect of the invention is detecting if a packet is present, and if so, determining the SOP time. If yes, the gains of the receiver need to be correctly set. Furthermore, the exact SOP needs to be determined in order to carry out the synchronization functions such as frequency offset and channel estimation. Note that the precise knowledge of SOP time may be delayed.

The preamble has a constant signal power. The signal payload part, on the other hand may have variable power, depending on the modulation used.

One aspect of the invention is detecting SOP and detecting SOP location using only the instantaneous RSSI indication obtained from a radio receiver, for example, the receiver of FIG. 4. The RSSI is detected in the receiver using a logarithmic amplifier to provide for a large dynamic range, in the order of 70 dB. In one embodiment, the RSSI indicator uses the I-channel output. In an improved implementation, the RSSI log detection is based on a combination of I- and Q-values. SOP detections using only the RSSI are called RSSI-based start events herein.

The instantaneous RSSI is noisy, and being an instantaneous strength indicator, should be averaged to indicate the power level. In one embodiment, one or more filtered versions of the instantaneous analog RSSI are used for SOP detection. One implementation uses three filters to give three filtered measures. The three filters have a short impulse response, a long impulse response, and a relatively very long impulse response, respectively.

In one embodiment, the filters are implemented digitally. The analog RSSI measurement, e.g., from the receiver, is sampled at a rate of 8 Msamples/s—in general (80/N) Msamples/s where N is an integer—using an ADC having a lower resolution—5-bits—than the receiver signal ADCs (ADCs 301 and 302). In one embodiment, the ADC also has a lower rate. In one embodiment, the ADC is a successive approximation ADC (ADC 303 of FIG. 3). In order to reduce power consumption, in one embodiment, the receiver signal ADCs e.g., ADCs 301 and 302, are turned to a low-power standby mode—e.g., turned off—during this time. In FIG. 3, ADCs 301 and 303 are pipeline ADCs each having a resolution of 10-bits. In another embodiment, one of the receiver ADCs is turned to a minimal power standby mode, e.g., turned off, and the other receiver ADC is used in a low-power lower resolution mode to obtain the RSSI measurement. This may be done, for example, by turning off some of the stages of the pipeline, so that a lower-resolution—e.g., 5-bit—output is produced. In one embodiment, the ADC sampling is also at a lower rate.

The pipeline ADCs and how they may be turned on and to a lower power standby state are described in U.S. patent application Ser. No. 09/930,091 to Allworth, et al., filed Aug. 15, 2001, incorporated herein by reference, and assigned to the assignee of the present invention. Furthermore, non-pipeline ADCs also may be used. For example, a non-pipeline ADC that can have a full-resolution, full-power state, and a lower-power, lower-resolution state, e.g., by having some stages turned off, may alternatively be used. In one embodiment, the lower-resolution state includes sampling at a lower rate.

Figure 8:
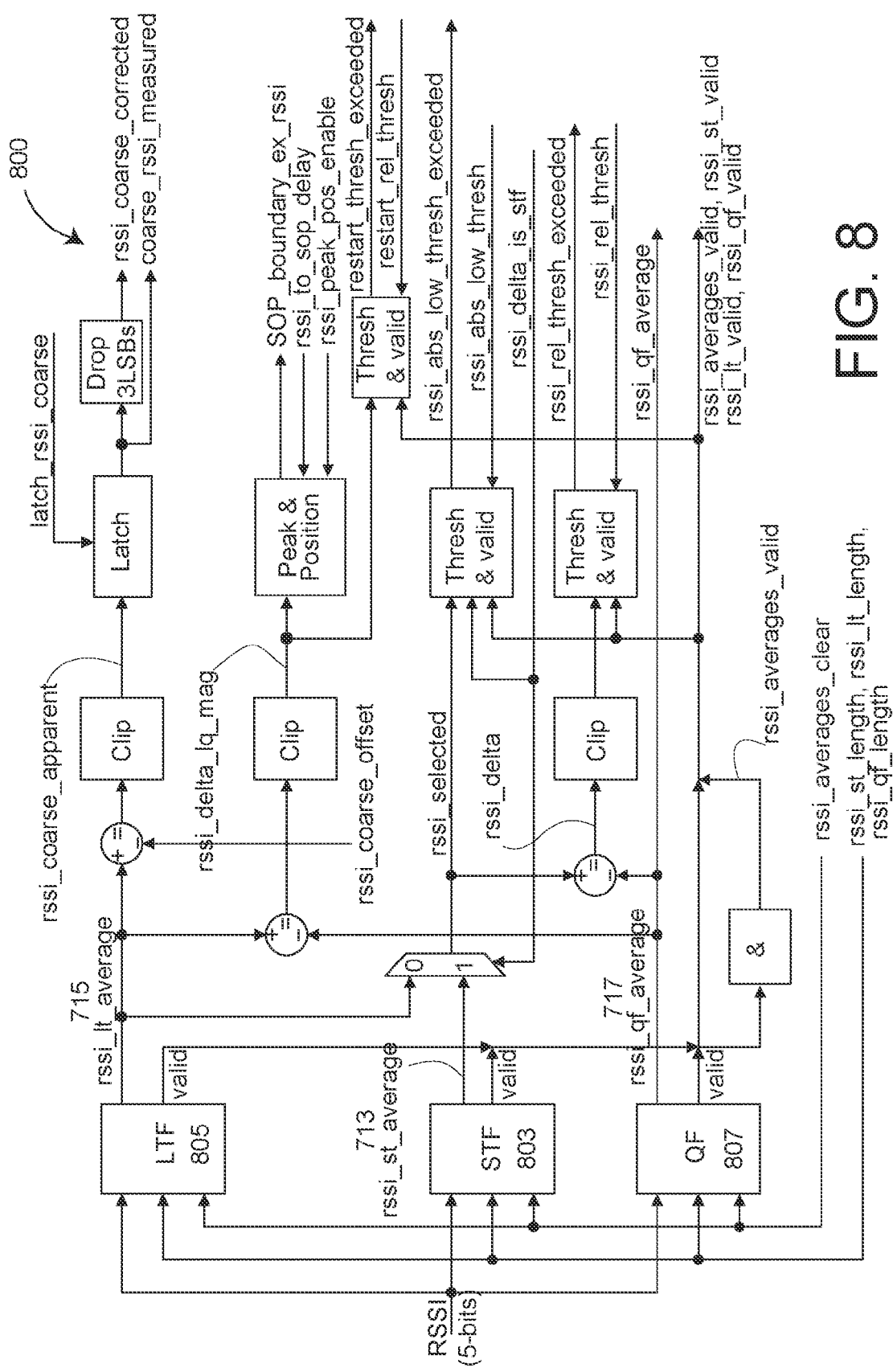
FIG. 8 shows three filters used to filter the RSSI measurements to determine a start event (the SOP) according to one embodiment of the invention.

FIG. 8 shows in simplified block diagram form that part 800 of the AGC data path for RSSI-based SOP determination. Three digital filters are included, termed the short-term filter (STF 703), the long-term filter (LTF 705) and the quiescent filter (QF 707), respectively. The QF is a very long-term filter and is so-called because its output nominally reflects the quiescent noise even after the other two filters' outputs increase after an SOP. The LTF also is called the power filter (PF) because its output is an average of the RSSI, therefore indicative of the received signal power. The input to each filter is the set of RSSI samples 801. Those in the art will appreciate that some details have been left out of FIG. 8, including latches at the outputs of the main processing blocks, clock signals, some reset signals, and so forth.

The outputs of the filters are shown in FIG. 7 (and FIG. 8) as STF output 713, LTF output 715, and QF output 717, respectively.

In one embodiment, each filter is a moving average filter. One embodiment provides varying the length of the filters. That is, the length is set by setting different values to a length variable. The short term filter is set by rssi_st_length to averaging lengths of 2, 3, 4, 5, 6, 7, 8, or 10 RSSI samples, the LTF by rssi_lt_length to 4, 8, 10, 12, 14, 16, 24, or 32 RSSI samples, and the QF by rssi_qf_length to 8, 16, 20, 24, 28, 32, 48, or 64 RSSI samples. The averaging filter outputs are 8-bits wide with 3 binary places.

Various embodiments of the invention detect the presence of a packet by one or more of the following start events. One embodiment is programmable to detect the presence of a packet by a combination of events.

The RSSI-only based start events are:

Low-absolute start event: the averaged RSSI level exceeds a low, absolute, selectable, power threshold.

Relative start event: the averaged RSSI level rises from its previous (quiescent) level by more than a relative, selectable, power step.

The low-absolute and relative start events depend only on the analog RSSI signal, and so permit the ADCs of the modem to be turned off. In a typical implementation, such as that of FIG. 3, the I-Channel and Q-channel ADCs may consume as much as 40% of the power in the device.

RSSI-Based Start Events

One embodiment provides for selecting which of the RSSI-based start events is used by enabling one of a set of binary flags denoted herein by use_low_thresh_for_start and use_delta_thresh_for_start, respectively. The names are self-explanatory. Their associated thresholds are denoted by rssi_abs_low_thresh and rssi_rel_thresh, respectively. In one embodiment, only one of the RSSI-based start events is enabled. Other embodiments permit more than one criterion to be enabled.

In one embodiment, each of filters 803, 805 and 807 has an output that indicates validity or invalidity. A filter output is invalid after a length change or after a reset or clear until it is refilled with new samples.

The two absolute threshold levels in one embodiment use the LTF rather than the STF. It was found that this provides more reliable results. Other embodiments may use the STF for the absolute level thresholds. The embodiment shown in FIG. 8 uses either the STF or the LTF depending on the value of a settable flag called rssi_delta_is_stf.

To comply with the IEEE 802.11a standard, if the received signal power is more than −62 dBm, then the receiver/modem combination is required to indicate to the MAC that the channel is busy. Furthermore, if the received signal has received signal power between −62 dBm and −82 dBm, then the SOP needs to be detected within 4 μs with a probability of 90%. Thus, a second threshold, called the low threshold rssi_abs_low_thresh is typically set at −82 dBm.

The "low-absolute start event" occurs when use_low_thresh_for_start and the LTF exceeds rssi_abs_low_thresh, is set and the LTF output is valid. If rssi_delta_is_stf is set, then the STF (and its valid marker) is used in place of the LTF.

Waiting until the absolute RSSI level rises above a threshold however does not take noise into account unless the threshold is calculated based on reasonably accurate noise predictions. Noise, for example, is a function of receiver gain. Initially, the output of the QF is approximately the quiescent noise level. Even when the RSSI rises, the LTF being shorter than the QF has a lag depending on the QF length, so an improved embodiment looks at the signal strength above quiescent (the relative start event). The relative start event is thus particularly suited to environments where the noise level is unknown and not readily predictable. The relative start event occurs when the LTF (if rssi_delta_is_stf is cleared in one embodiment) exceeds the QF by more than rssi_rel_thresh and the LTF output is valid. The LTF is shorter than the QF, so that the LTF output climbs faster than the QF output upon the step RSSI increase due to an arriving packet. In the case of a moving average filter, the QF initially remains at the quiescent, i.e., quiescent noise level.

In one embodiment, if rssi_delta_is_stf is set, then the STF (and its valid marker) is used in place of the LTF.

Threshold Selection

This section describes how to choose rssi_abs_low_thresh, and the closely related Coarse-Offset-Table. Since threshold selection depends intimately on the radio receiver set-up, both theory-based and experimental techniques are described.

In one embodiment, the thresholds are set so as to meet the IEEE 802.11a specification. Other embodiments set thresholds for the respective specification the radio and modem is required to meet. Beyond that, thresholds are set as a trade-off between minimizing false alarms and misses. To get maximum sensitivity, the thresholds should be set to give the maximum tolerable false alarm rate. Note that false alarms make the receiver unavailable for genuine packets, so in one embodiment, the thresholds are set so that the percentage of time responding to a false alarm is usually below 0.5%. Given this choice of threshold, the miss rate decreases progressively with increasing packet carrier-to-noise ratio (CNR), down to a minimum equal to the false alarm rate.

The RSSI-based thresholds can be set nearer to the noise floor without increasing false alarm rate if more noise averaging is employed (longer filter lengths). However, only approximately two-to-three short symbols are available for packet detection and level measurement, so there is a limit to the available averaging. In addition, longer filter lengths can decrease the accuracy of knowing when a packet started. Normally, AGC must determine the start-of-packet to within ±400 ns.

The following describe calculations of threshold that in one embodiment, require the mean RSSI voltages $V_{-82}$ that occur due to −82 dBm OFDM or Gaussian signals applied to the radio receiver. The radio receiver gain control bits and RSSI bias level must be set to their default values. $V_{-82}$ may be obtained from the radio receiver data-sheet available from the manufacturer of the radio receiver, e.g., of transceiver 400, or experimentally. In the modem embodiment of FIG. 3, the 5-bit RSSI-ADC 303 converts voltages between 0V and 1.8V to 32 levels. $V_{-82}$ is represented by $R_{-82}=32/1.8 V_{-82}$ mean RSSI levels.

Determining rssi_abs_low_thresh

The IEEE 802.11a standard requires that the packet error rate for 6 Mbit/s packets at −82 dBm be less than 10%. Note that the specified error rate includes packets with bit errors and missed packets. The threshold rssi_abs_low_thresh is used to detect packets at −82 dBm and above. Its units are eighths of an RSSI level, so as a first approximation rssi_abs_low_thresh should satisfy $$rssi\_abs\_low\_thresh \leq 8R_{-82}=8 \cdot 32/1.8 V_{-82}.$$

Setting rssi_abs_low_thresh somewhat below the right-hand-side allows the 10% error rate to be met (rssi_abs_low_thresh may be reduced further, for increased sensitivity, as long as the false alarm rate remains low).

However, since the mean RSSI signal reflects the mean $\mu_l$ of the logarithm of instantaneous power, its value is different from the desired mean $\mu$, of instantaneous power. The logarithm emphasizes signals near zero, so $\mu_l$ underestimates (is a biased estimator of) $\mu$. The bias depends on the amount of averaging. For a real Gaussian or OFDM signal, and assuming that the mean is calculated from N values, then $$\mu_l = \begin{cases} 2\pi^{-\frac{N}{2}} \Gamma^N\left(\frac{1}{2} + \frac{1}{N}\right)\mu & N < \infty \\ 2\exp\left(\frac{\Gamma'\left(\frac{1}{2}\right)}{\Gamma\left(\frac{1}{2}\right)}\right)\mu & N = \infty \end{cases}$$

where $\Gamma(.)$ is the gamma function and is widely available in mathematical software. The factor $$2\exp\left(\frac{\Gamma'\left(\frac{1}{2}\right)}{\Gamma\left(\frac{1}{2}\right)}\right)$$

is approximately equal to 0.282154.

If $V_{-82}$ is determined by a voltmeter, then the averaging is effectively infinite, and so $V_{-82}$ incorporates factors of 0.282154. By comparison, the averaging used within the modem is much less and is set by L(rssi_st_average), L(rssi_lt_average) and L(rssi_qf_average), where L(.) indicates the length of the filter in samples.

This threshold choice may also be obtained experimentally as follows. A regular stream of 6 Mbit/s packets at –82 dBm is applied to the radio receiver. The values are adjusted of rssi_abs_low_thresh until rssi_abs_low_thresh_exceeded transitions from low-to-high at the same time as the received packet. If rssi_abs_low_thresh_exceeded is often high before the packet arrives, then there are too many false alarms and rssi_abs_low_thresh should be increased; conversely if rssi_abs_low_thresh_exceeded often stays low after the packet arrives, then there are too many misses and rssi_abs_low_thresh should be decreased.

$$C(N) = 10\log_{10}\left(\exp\left(\frac{\Gamma'\left(\frac{1}{2}\right)}{\Gamma\left(\frac{1}{2}\right)}\right)2\pi^{-\frac{N}{2}}\Gamma^N\left(\frac{1}{2} + \frac{1}{N}\right)\right)$$

Determining rssi_rel_thresh

A relative start event may approximately replace a low-absolute start event, by respectively converting the dB step changes of $S_{-82}=-82$ dBm—quiescent noise power into rssi_rel_thresh units.

The inventors found that it is reasonable to assume that as a first approximation, noise produces a DC RSSI level. A packet S dB above the noise may thus cause a step rise of $S/\Delta$ RSSI levels. Therefore the outputs of the LTF and QF increase approximately linearly to the new value, after L(rssi_lt_length), and L(rssi_qf_length) new RSSI samples are received, respectively. The difference rssi_lt_average–rssi_qf_average is compared against rssi_rel_thresh (with appropriate scaling). The maximum difference occurs when rssi_lt_average has reached the new value, but rssi_qf_average is still climbing. This point occurs after L(rssi_lt_length) new RSSI samples, and the difference equals $$\frac{S}{\Delta}\left(1 - \frac{L(\text{rssi\_lt\_average})}{L(\text{rssi\_qf\_average})}\right)$$

RSSI levels. Thus reasonable choices for rssi_rel_thresh include $$\text{rssi\_rel\_thresh} \leq \frac{S_{-82}}{\Delta}\left(1 - \frac{L(\text{rssi\_lt\_average})}{L(\text{rssi\_qf\_average})}\right)$$

The above discussion assumes that rssi_delta_is_stf is cleared for the embodiment that permits using the LTF or the STF; if not, each instance of "Long-Term" and "rssi_lt_length" must be replaced by "Short-Term" and "rssi_st_length", respectively. This is also true for embodiments that only use the STF.

The threshold may also be determined experimentally, as follows. The AGC is set for this start event detection and the radio receiver is set to its intended default gain. The GCI is disabled. A regular stream of 6 Mbit/s packets at –82 dBm (or –62 dBm) is applied to the radio receiver. Adjust rssi_rel_thresh until rssi_rel_thresh_exceeded transitions from low-to-high at the same time as the received packet. If rssi_rel_thresh_exceeded is often high before the packet arrives, then there are too many false alarms and rssi_rel_thresh should be increased; conversely if rssi_rel_thresh_exceeded often stays low after the packet arrives, then there are too many misses and rssi_rel_thresh should be decreased.

In one embodiment, the AGC's FSM is optimized for minimum power consumption. When waiting for a packet, the ADCs 301 and 302 are powered down, and only the RSSI-based start events are possible.

When waiting for a packet, the AGC FSM is in ARMED state. Normally rssi_delta_is_stf is cleared.

An RSSI-based start event identifies that a packet is present, but, due to averaging, the relationship between the start event and the packet start time depends on CNR. At high CNR, averages climb quickly and thresholds are exceeded almost immediately; whereas at low CNR, averages climb slowly and the start event happens when the filters are nearly filled.

Figure 9:
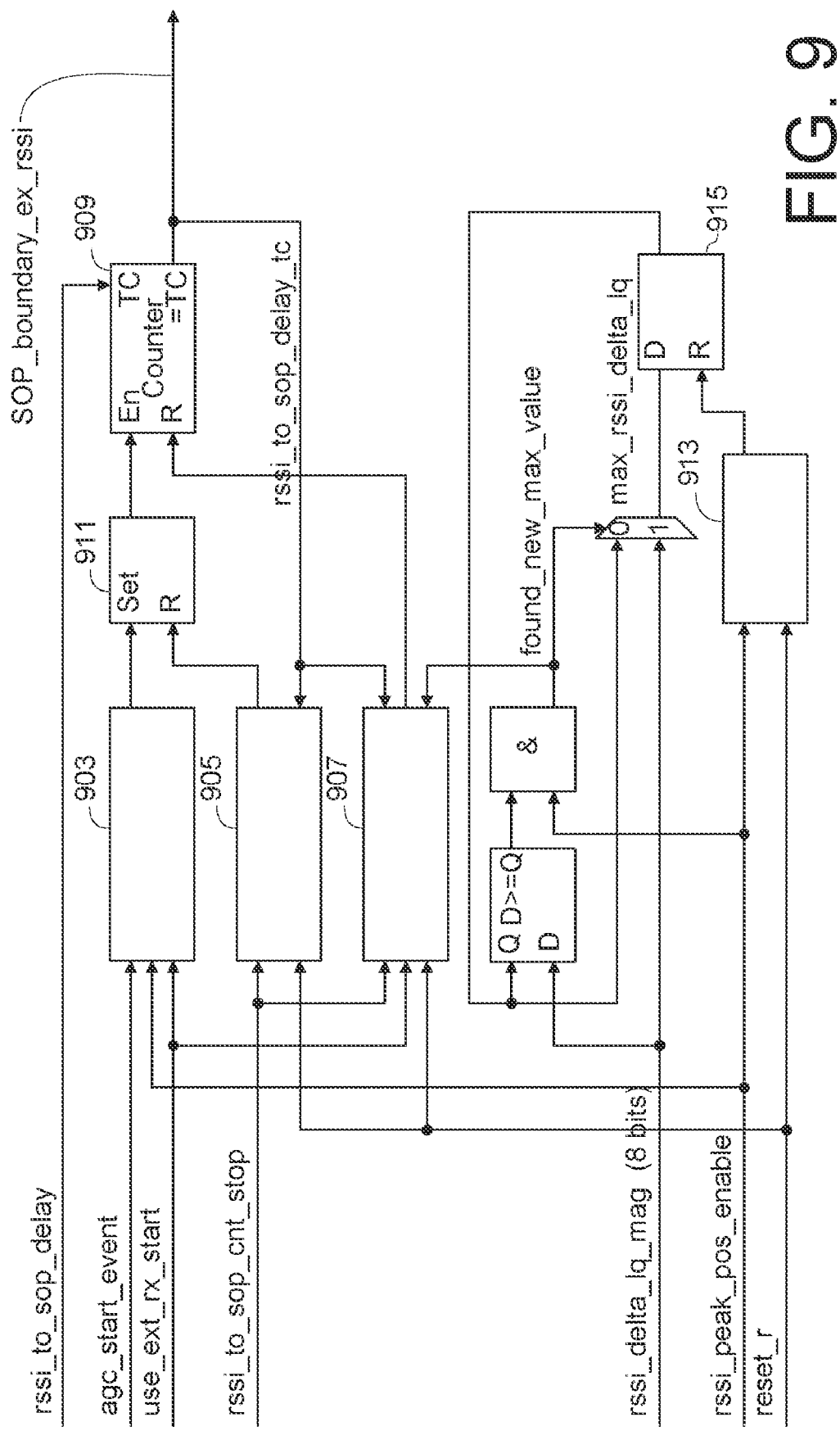
FIG. 9 shows the data path logic to find the peak difference between the long term and quiescent filters, and to issue a pulse a number of clock cycles later, in accordance to one embodiment of the invention.

There thus is a need to accurately determine the SOP time. In one embodiment, the RSSI-based start event triggers a search for a refined estimate of SOP time. FIG. 9 shows a logic circuit to find the peak difference between the long term and quiescent filters 805 and 807, respectively, and to issue a pulse a number (rssi_to_sop_delay) of clock pulses later. The difference between the LTF and QF outputs peaks L(rssi_lt_length) RSSI sample periods into the packet. The inventors have found that this is so for all reasonable CNR values. In the logic circuit of FIG. 9, the start event triggers a peak search, terminated after L(rssi_lt_length) RSSI sample periods, in order to guarantee seeing the peak whatever the CNR. Once a peak is found, a counter 909 is started with terminal count equal to rssi_to_sop_delay, in multiples of clock pulses (12.5 ns with a 80 MHz clock). Since the peak position is known as L(rssi_lt_length) RSSI sample periods into the packet and rssi_to_sop_delay is known, the terminal count time is determined.

A pulse, SOP_boundary_ex_rssi, is issued at terminal count to mark this known point. The signal SOP_boundary is SOP_boundary_ex_rssi and it is SOP_boundary that reports this timing estimate to the rest of the modem.

Note that while in general, SOP_boundary_ex_rssi (and thus SOP_boundary) may not be perfectly accurate (the peak position may be confused by noise and multipath), the inventors have found that it is restricted to within ±0.5 short symbols with high probability for a wide range of CNR, multipath conditions and averaging lengths (including averaging lengths much greater than a short symbol). The peak is most distinct if the QF length is twice the LTF length.

Clocks are not shown in FIG. 9, and in one implementation, are 80 MHz. Logic unit 903 generates an edge to set the flip-flop 911 on the OR of (rssi_pk_pos_enable) and ((agc_start_event) AND (use_ext_rx_start)). Logic unit 905 takes the bitwise OR of reset_r, rssi_to_sop_delay_tc and rssi_to_sop_cnt_stop to form the reset of Flip-flop 911. The counter is reset by the output of unit 907's output is true when (reset_r OR rssi_to_sop_delay_tc OR rssi_to_sop_cnt_stop OR (found_new_max_value AND NOT(use_ext_rx_start))) is true.

In one embodiment, the peak search includes restarting the counter 909 every time the average (or difference between averages, in the case of a relative start event) exceeds the largest previous average (i.e. a to-date peak). Thus, the counter continually restarts until the global peak is found, whereupon there is no new peak to restart the counter. This means that rssi_to_sop_delay should exceed L(rssi_lt_length)×RSSI sample period to guarantee finding the global peak. One implementation of restarting the counter every time the to-date peak is exceeded is shown in FIG. 9. Logic unit 913 forms (reset_r AND NOT rssi_pk_pos_enable). Unit 915 is a clocked D-flip-flop.

As well as initiating the peak search to determine the SOP position, the start event causes the FSM to transition to the COARSE_MEASURE state.

In one embodiment of the radio receiver, the RSSI signal is only filtered by an IF SAW device, so that significant adjacent channel power may be present. This may falsely cause the low-absolute start event. The start of an adjacent channel packet may well cause a relative start event. Moreover, even if the false alarm is corrected, the continued presence of one or more adjacent channel interferers is likely to prevent a relative start event even when a genuine packet arrives. Therefore the RSSI-only SOP detection method works best when adjacent channel interference is not present or weak.

Figure 12:
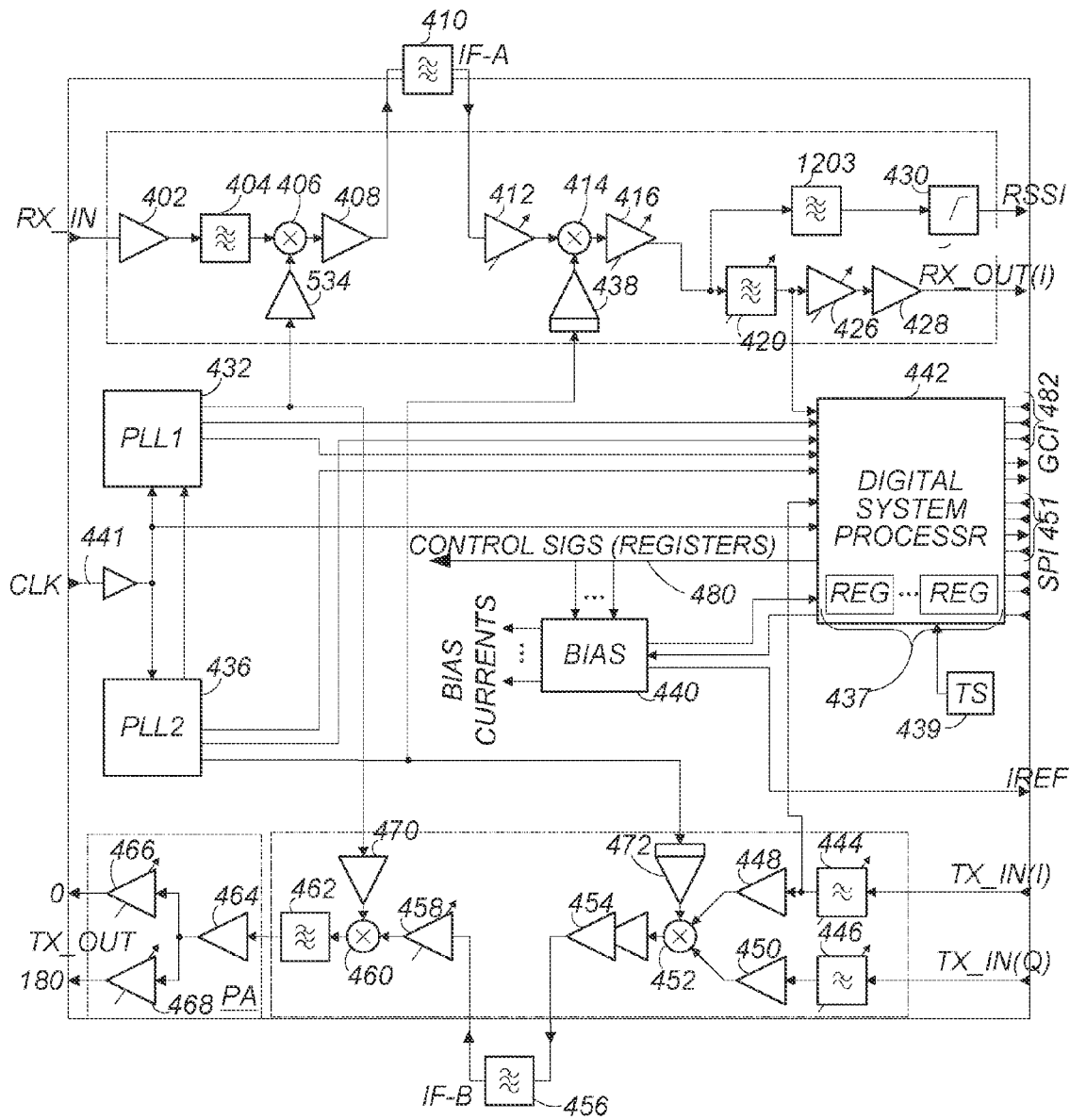
FIG. 12 shows an implementation of a receiver similar to FIG. 4, but with only a single output and with an additional bandpass filter to further filter the received signal prior to the log detector that produces the analog RSSI output.

In an improved embodiment, a separate bandpass filter is used in the path of the RSSI log detector. FIG. 12 shows an implementation of a receiver similar to FIG. 4, but with only a single output rather than I and Q outputs, and also with an additional bandpass filter 1203 to further filter the received signal prior to the log detector 430 that produces the analog RSSI output. The filter 1203 is a bandpass filter chosen to have a sufficiently narrow bandwidth to substantially reject adjacent channels, but a sufficient bandwidth to provide a reliable RSSI measurement, i.e., providing sufficiently high in-band signal energy. The exact characteristics of the additional RSSI filter 1303 may be chosen experimentally as a tradeoff between preserving much of the in-band signal energy and good adjacent channel rejection.

Coarse AGC Setting

Once the algorithms have determined that a packet is present, the coarse AGC is carried out. These are the three states COARSE_MEASURE 615, COARSE_ADJUST 615 and COARSE_SETTLE 617.

One aspect of the invention is providing one or more lookup tables for setting the gains of the radio receiver that map signal measurements into appropriate gain settings. By providing loadable lookup tables, the mapping from power measurement to gain settings can be changed to account for different radio receivers that have different characteristics, and also to account for process and temperature variations. This aspect increases the yield and thus decreases the per unit cost of the receiver chips, since higher process variations (and also temperature variations) may then be tolerated.

According to another aspect of the invention, different versions can be made of the same radio components that perform differently. For example, the lookups tables may be set that make the receiver a low-power receiver, a different set of lookup tables may be set for a low-noise version of the receiver, and so forth. This aspect also increases the yield and thus decreases the per unit cost of the receiver chips, since the one receiver design may be used for many different applications.

Loadable tables are used for both coarse and fine AGC setting. During this coarse measure stage, the received signal strength, rssi_coarse_apparent, is calculated as the average of the RSSI samples, less an offset. Referring to FIG. 8, consider the case of RSSI measurements being used to determine the coarse gain. The output of LTF 805 in one embodiment is corrected subtracting from it a value rssi_coarse_offset that is obtained from a memory containing a loadable table called the Coarse-Offset-Table. FIG. 10 shows the data path for setting the gains that includes the Coarse-Offset-Table 1003. The offset used depends on the present coarse gain settings that are provided in a coarse gain register 1005. The bbbbth Coarse-Offset-Table entry represents the radio receiver gain between the antenna input and RSSI log-amp input given the coarse gain control bits bbbb. For the case of the transceiver 400 of FIG. 4 being used, the representation takes the 16 radio receiver gains in dB, scales them by 1/Δ to convert them into RSSI levels, then subtracts the minimum value off all values (so that at least one entry is 00000). These comprise the Coarse-Offset-Table.

The Coarse-Offset-Table may also be determined experimentally. The radio receiver coarse gain control bits are set to minimum gain. A continuous OFDM signal or Gaussian noise is applied to the radio receiver to the radio receiver that is at least 6 dB above the noise floor. rssi_qf_length is set to its maximum. The coarse gain control bits are varied over their range. For each coarse gain setting, the 8-bit rssi_qf_average is read repeatedly and recorded. After all coarse gain settings have been visited, a 16×5-bit table is produced. The minimum table entry is subtracted from all entries to obtain the Coarse-Offset-Table.

The COARSE_ADJUST state, briefly explained above, is when the modem calculates the appropriate radio receiver gain control bits and then serially transfers them via a command (using the GCI) to the radio receiver. The RSSI measurement registered during the RSSI_MEASURE state is called coarse_rssi_measured. Its five most significant bits (MSBs) provide an address into a memory containing a loadable 32×10 lookup table, called the Coarse-Gain-Table 1007. This table maps the measured signal strength into the appropriate radio receiver gain control bits. A high signal strength should map to a low radio receiver gain, and vice versa. The radio receiver gain control bits are prepended with a GCI op-code that instructs the receiving port at the receiver to set the coarse gains, then transferred to the radio receiver via the Gain Control Interface. The logic block 1009 is used for controlling the GCI. One embodiment provides full gain setting, i.e., all the gains being set, while another modifies only the coarse gains at the radio receiver. A flag use_both_gains determines the type of transfer, and if this flag is set, then the "full" GCI op-code is sent, along with all 10 radio receiver gain control bits. These set the radio receiver's coarse and fine gains. Normally, use_both_gains is cleared, so that only the "coarse" GCI op-code is sent, along with the four most significant bits from the Coarse-Gain-Table 1007. These set the radio receiver's coarse gain only, and the remaining 6 less significant bits in lookup table 1007 are ignored. The serial transfer is handled by the GCI module. The AGC FSM transitions to COARSE_SETTLE once the GCI module has finished the transfer.

Fine AGC Setting

Fine AGC is made up of three states: the FINE_MEASURE 619, FINE_ADJUST 621, and FINE_SETTLE 623 states.

Figure 11:
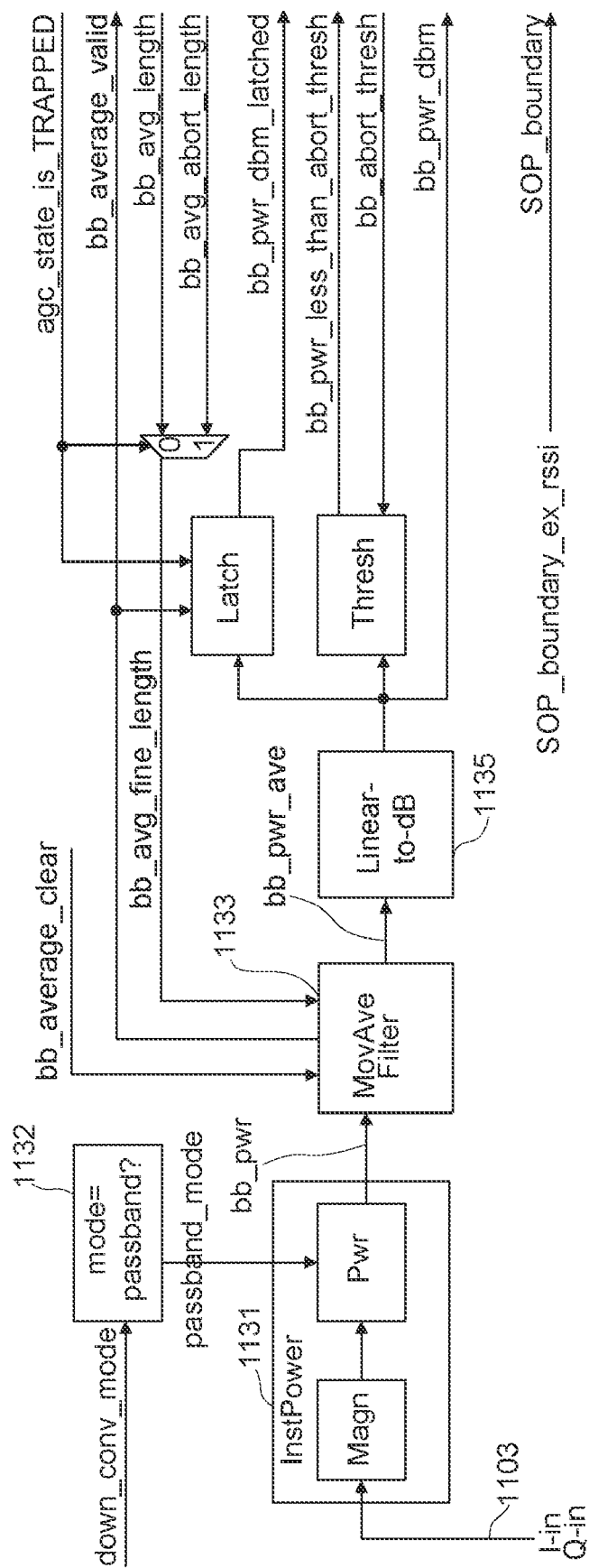
FIG. 11 shows the data path logic for measuring the average power in order to set the fine gains according to one embodiment of the invention.

The measurement of the power will first be described with the aid of FIG. 11. In one embodiment, both the received I-signal and the received Q-signal are used, while in another, only the received I-signal is used. One embodiment provides for both types of measurements according to the value of a flag called down_conv_mode. Logic unit 1132 generates a flag called passband_mode when both I and Q are used. Both I and Q being on will be assumed in the discussion, and is would be clear to those in the art how the I-only calculations occur. Referring then to FIG. 11, with the ADCs on, the samples of the received signal from the I-ADC 301 and Q ADC 302 are converted to power measurements by power unit 1131 that determines the magnitudes of I and Q by clipping at least the sign bit, and then determines the instantaneous power bb_pwr. The power bb_pwr is averaged by a moving average filter 1133 to determine the average power bb_pwr_ave. The amount of averaging in one embodiment is settable by a value bb_avg_fine_length that is determined from a register value bb_avg_length. Validity and clear signals also are used as shown.

Note that in one embodiment, power unit 1131 determines the magnitude rather than the square magnitude. This is done to reduce the number of bits required.

It is desirable to use a lookup table to set the fine radio receiver gains. The output of the moving average filter in one embodiment is 16-bits. And it is not practical to have a lookup table indexed by a 16-bit number. In one embodiment, a linear to logarithmic process 1135 maps bb_pwr_ave to an approximately logarithmic scale to produce a 6-bit (64 logarithmic scale) quantity bb_pwr_dbm with steps that are separated by approximately 1 dB.

Referring now to FIG. 10, when this logarithmic value bb_pwr_dbm is copied to a status register fine_rssi_measured, immediately the average value becomes valid. At the same time that the average value becomes valid, fine_rssi_measured is subtracted from a desired input level, bb_pwr_setpoint, by subtractor 1033. The signed result is copied to a status register bb_pwr_undershoot. If fine_rssi_measured is higher than bb_pwr_setpoint, then bb_pwr_undershoot is negative, and this is an indication that the radio receiver gain is too high, and it must be reduced (and vice versa).

In one embodiment designed to work with the transceiver of FIG. 4, fine AGC can only change the 6 fine radio receiver gain control bits to be sent via the GCI. As a simplification, a gain change is implemented by adding the gain error, bb_pwr_undershoot, to the current fine radio receiver gain control bits set after the last default adjust, or after coarse AGC if use_both_gains was set, and then this new value is sent to the radio receiver. However, the fine radio receiver control bits are only nominally 1 dB/step, and may suffer from gain non-linearity, or even non-monotonicity. Therefore the current fine radio receiver gain control bits are first linearized by a loadable 64×6 Fine-Offset-Table 1035 contained in a memory, and the resulting rssi_fine_offset is then adjusted by addition with bb_pwr_undershoot (adder 1037). The result is clipped to a 6 bit unsigned value rssi_fine_corrected, then inverse linearized by a loadable 64×6 Fine-Gain-Table 1039 contained in a memory. The table output comprises the new fine radio receiver control bits, and these are handed over to the GCI module for transmission to the radio receiver. The GCI op-code is always specified as "fine". The AGC FSM transitions the state to the FINE_SETTLE state once the GCI module has finished the transfer.

The values of tables 1035 and 1039 are determined experimentally to achieve the desired signal-to-noise ratio at the radio.

When AGC is Trapped

After coarse and fine AGC, the AGC FSM enters the TRAPPED state 625, where the radio receiver gain is trapped (fixed). The received signal is stable, and so synchronization tasks may begin at the modem. In one embodiment, the SOP_boundary pulse should be issued at or about when the AGC FSM enters the TRAPPED state.

Given an RSSI-based start event, SOP_boundary is issued rssi_to_sop_delay multiples of clock pulses (12.5 ns at 80 MHz) after an RSSI delta peak (see FIG. 9).

When the SOP_boundary pulse is issued, the AGC unit and, in one embodiment, also the synchronization section of the modem perform a series of "reasonability" tests upon the received signal, with outputs called abort_exceeded and restart_exceeded. These are asserted whenever the received signal does not resemble a normal packet. However, while in the TRAPPED state, the AGC FSM defers to the RX FSM, and the RX FSM is free to use or disregard any of these signals.

The abort_exceeded signal is constructed as follows. The ADC power average is cleared except in the FINE_MEASURE and TRAPPED states. In TRAPPED, the averaging length is controlled by bb_avg_abort_length, which sets the averaging length, L(bb_avg_abort_length), in one embodiment to one of 1, 2, 4, 8, 16, 32, 64, or 128 samples. Once L(bb_avg_abort_length) samples are received, the average is valid, and an abort_exceeded is allowed. After this, abort_exceeded is asserted if bb_pwr_dbm falls below bb_abort_thresh. Therefore bb_abort_thresh should be set well below bb_pwr_setpoint to avoid spurious aborts.

The signal restart_exceeded indicates that the RSSI level has increased markedly. This may happen when a strong packet arrives from a nearby transmitter after the receiver has triggered off noise or off a weak packet from a transmitter in a different, distant cell.

In one embodiment, the restart_exceeded signal is constructed as the difference between the RSSI long-term and quiescent filters, rssi_lt_average−rssi_qf_average. The RSSI averages are cleared briefly at the end of the DEFAULT_SETTLE and FINE_SETTLE states. Once the RSSI filters are filled up again, their averages are valid, and a restart_exceeded may be signaled. After this, restart_exceeded is asserted if the difference exceeds restart_rel_thresh.

If the RX FSM aborts the current packet, it notifies the AGC FSM via a reset pulse, which takes the AGC FSM to the RESET state (see FIG. 6). Immediately afterwards, it asserts the arm_agc signal, which shifts the AGC FSM to the ARMED state.

If the packet runs to completion, the RX_FSM asserts rearm_agc and the AGC FSM switches to the DEFAULT_ADJUST state.

Default AGC

Default AGC is made up of the two states: DEFAULT_ADJUST 607 and DEFAULT_SETTLE 609. The modem commands the radio receiver to change its gain to rx_default_gain, which is selected to allow packets having a broad range of signal strengths to be detected reliably.

The log amplifier in the RSSI detector of the radio receiver provides an RSSI measurement over a large dynamic range, around 70 dB in one embodiment. Different systems may need different default gains to effectively detect the SOP. Thus, the default gains are settable by a register that contains rx_default_gain. This quantity is chosen to allow for a wide range of receivers and for process and temperature variations.

The GCI op-code is always specified as "Full". The op-code and data of the third GCI transfer after the receiver exits the ARMED state are stored as gci_data_reg2. The AGC FSM transitions to DEFAULT_SETTLE once the GCI module has finished the transfer.

Thus, while some embodiments, contexts, and applications have been described herein, the invention is not limited to those embodiments, contexts, and applications.

Note that in the above description, many settable variables, flags, and tables have been described. These provide for flexibility. Furthermore, by a loadable table is meant a table whose entries are settable. In one embodiment, these variables, flags, etc. are loaded into the corresponding registers 327 in the modem chip such as the chip shown in FIG. 3 via the configuration port SPI. One way of loading the settable registers is via the host processor shown in FIG. 2. Different embodiments of the invention may have more or fewer such registers and corresponding settable parameters or flags.

Many justifications and explanations and assumptions were described above when explaining how the inventors arrived at particular thresholds to use in various aspects of the invention. The invention however does not depend on any of these assumptions holding. Any other theory-based, guessed at, or experimentally determined thresholds may alternatively be used.

While each of the short term, long term, and quiescent filters described herein are finite impulse response filters, and in particular, moving average filters, other embodiments may use a different filter structure, for example, infinite impulse response filters.

While the false alarm, i.e., correlation peak confirmation circuit and method described above attempts, once a correlation peak is detected, to detect a second correlation peak a short symbol delay after the first peak, the circuit is clearly modifiable to detect a later correlation peak any integral number of short symbol delays later.

While the above described embodiments determined correlations in the time domain by filtering with a finite impulse response filter that was quantized to one bit so that only add and accumulate operations can be used to calculate the correlation, in another embodiment, different quantization is used. Furthermore, in other embodiments, one or more of the correlations are determined in the frequency domain.

While the false alarm, i.e., correlation peak confirmation circuit and method described above attempts, once a correlation peak is detected, to detect a second correlation peak a short symbol delay after the first peak, the circuit is clearly modifiable to detect a later correlation peak any integral number of short symbol delays later.

While in the above embodiments, the correlation-based "matched filters" for detecting short symbols or the guard interval of the long preamble part use the magnitude of the complex correlation, other embodiments may use other measures. For example, the squared magnitude is known to give the theoretical best detection for some signals. Using the magnitude is a compromise between the best performance and the number of bits of the output. Similarly, the baseline for peak detection uses the average correlation magnitude, and other embodiments may use the average power. The average power is known in theory to give better performance, but determining such an average-power-based baseline may require more hardware.

While one transceiver embodiment of the invention includes a superheterodyne receiver, other receiver architectures may also benefit from the invention.

Furthermore, while, one transceiver embodiment of the invention is for half-duplex operation, the invention is not restricted to any particular mode of operation. Other modes of operation, include, for example, TDMA half-duplex and TDMA full-duplex, may benefit from the invention.

While a transceiver embodiment for operation with RF frequencies in the 5 GHz range has been described, the invention may be embodied in transceivers operating in other RF frequency ranges. Furthermore, while a transceiver embodiment for operation conforming to the IEEE 802.11a standard has been described, the invention may be embodied in transceivers conforming to other standards and for other applications, including, for example, the IEEE 802.11b and 802.11g standards, other WLAN standards, bluetooth, GSM, PHS, and other cellular wireless telephony standards. Applications that can be accommodated by RF transceiver 400 include IEEE 802.11a COFDM wireless LANs and links, wireless Ethernet, Hiperlan I, Hiperlan II, European Technical Standards Institute (ETSI) broadband radio access network (BRAN), and multimedia mobile access communication (MMAC) systems, wireless local area networks, local multipoint distribution service (LMDS) IF strips, wireless digital video, wireless USB links, wireless IEEE 1394 links, TDMA packet radios, low-cost point-to-point links, voice-over-IP portable "cell phones" (wireless Internet telephones), etc.

Furthermore, while embodiments described herein are for an integrated circuit that includes MOS transistors, the invention is not restricted to MOS transistor circuits. Furthermore, while CMOS embodiments are described herein, the invention is not restricted to a CMOS integrated circuit.

Furthermore, while the start event and SOP detection described herein uses what is called an "RSSI" measurement, and in one implementation, this is detected by a log amplifier, the invention is not restricted to any particular type of RSSI measurement, and alternate embodiments may use different measures of received signal strength. In general, the RSSI measurement provides a measure of the signal strength over a relatively wide dynamic range. A particular embodiment uses a detector that compresses the dynamic range of the received signal, and one such detector is a log detector.

Furthermore, while the embodiment described herein uses one or more memories storing one or more lookup tables for the signal strength to gain setting mappings, mappings may be stored other than as lookup up tables, for example as formulae or as procedures for determining the gain setting from the signal strength.

Thus, while there has been described what is believed to be the preferred embodiments of the invention, those skilled in the art will recognize that other and further modifications may be made thereto without departing from the spirit of the invention, and it is intended to claim all such changes and modifications as fall within the scope of the invention.

What is claimed is:

1. A method for adjusting the gains of a radio receiver for packetized data, the radio receiver having one or more adjustable gains and including a first set of one or more analog-to-digital converters (ADCs) to convert one or more analog received signals to samples of the received signals, the method comprising:
   adjusting the gains to a default gain level;
   measuring the received signal strength (RSSI) over a relatively wide dynamic range;
   with the gains at the default gain level, detecting a start event by using the measured RSSI, the start event indicative of the radio receiving a packet;
   determining an estimate of the start of packet (SOP) time;
   using the received signal samples from the ADCs, obtaining a fine measure of the average signal strength; and
   adjusting the gains of the radio receiver to a fine gain level according the fine measure of the average signal strength,
such that the receiver gains are set to receive the remainder of the packet indicated by the start event.

2. A method as recited in claim 1, further comprising:
   after the start event and before obtaining the fine measure, determining a measure of the average signal strength from the measured RSSI; and
   adjusting the gains of the radio receiver to a coarse gain level according to the determined average signal strength measure.

3. A method as recited in claim 2, wherein the adjusting of gains is according to one or more selected lookup tables that map signal measurements into appropriate gain settings,
   wherein the selected lookup tables are changeable such that the mapping from power measurement to gain settings can be changed to account for the characteristics of the radio receiver.

4. A method as recited in claim 1, further comprising:
   filtering the measured RSSI by a first filtering operation to produce a filtered RSSI,
wherein the start event detecting and the SOP time determining uses the filtered RSSI.

5. A method as recited in claim 4, wherein the radio receiver conforms to a standard and wherein the gain adjusting is completed by the time allowed for automatic gain control (AGC) by the standard.

6. A method as recited in claim 5, wherein the standard is an IEEE 802.11 OFDM standard.

7. A method as recited in claim 4, wherein the adjusting of gains is according to one or more selected lookup tables that map signal measurements into appropriate gain settings,
   wherein the selected lookup tables are changeable such that one or more of the radio receiver's characteristics are changeable by changing one or more of the selected lookup tables.

8. A method as recited in claim 1, wherein the adjusting of gains is according to one or more selected lookup tables that map signal measurements into appropriate gain settings,
   wherein the selected lookup tables are changeable such that the mapping from power measurement to gain settings can be changed to account for the characteristics of the radio receiver.

9. A method as recited in claim 1, wherein the adjusting of gains is according to one or more selected lookup tables that map signal measurements into appropriate gain settings,
   wherein the selected lookup tables are changeable such that one or more of the radio receiver's characteristics are changeable by changing one or more of the selected lookup tables.

10. A system comprising:
    means for adjusting the gains of a radio receiver for packetized data to a default gain level, the radio receiver having one or more adjustable gains and including a first set of one or more analog-to-digital converters (ADCs) to convert one or more analog received signals to samples of the received signals, the method comprising;
    means for measuring the received signal strength (RSSI) over a relatively wide dynamic range;
    means for detecting a start event coupled to the means for measuring the RSSI, the means for detecting operative, with the gains at the default gain level, to detect a start event by using the measured RSSI, the start event indicative of the radio receiving a packet;
    means for determining an estimate of the start of packet (SOP) time;
    means for obtaining a fine measure of the average signal strength using the received signal samples from the ADCs,; and
    means for adjusting the gains of the radio receiver to a fine gain level according the fine measure of the average signal strength,
such that the receiver gains are set to receive the remainder of the packet indicated by the start event.

11. A system as recited in claim 10, further comprising:
    means for determining a measure of the average signal strength from the measured RSSI, the means for determining the measure of the average signal strength operative after after the start event and before completion of obtaining the fine measure by the means for obtaining the fine measure; and
    means for adjusting the gains of the radio receiver to a coarse gain level according to the determined average signal strength measure, the means for adjusting the gains to a coarse gain level operative after the start event and before completion of obtaining the fine measure by the means for obtaining the fine measure.

12. A method as recited in claim 10, further comprising:
    means for filtering the measured RSSI by a first filtering operation to produce a filtered RSSI,
wherein the means for detecting start event and the means for determining the estimate of the SOP time determining use the filtered RSSI.

13. A system as recited in claim 12, wherein the radio receiver conforms to a standard and wherein the gain adjusting is completed by the time allowed for automatic gain control (AGC) by the standard.

14. A method as recited in claim 13, wherein the standard is an IEEE 802.11 OFDM standard.

* * * * *